(12) United States Patent
Shimizu

(10) Patent No.: US 10,665,682 B2
(45) Date of Patent: May 26, 2020

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 16/281,319

(22) Filed: Feb. 21, 2019

(65) Prior Publication Data

US 2020/0091297 A1 Mar. 19, 2020

(30) Foreign Application Priority Data

Sep. 14, 2018 (JP) .................... 2018-173110

(51) Int. Cl.
| | | |
|---|---|---|
| H01L 29/16 | (2006.01) | |
| H01L 29/66 | (2006.01) | |
| H01L 21/324 | (2006.01) | |
| H01L 29/78 | (2006.01) | |
| H01L 29/51 | (2006.01) | |

(52) U.S. Cl.
CPC ........ H01L 29/1608 (2013.01); H01L 21/324 (2013.01); H01L 29/513 (2013.01); H01L 29/518 (2013.01); H01L 29/66068 (2013.01); H01L 29/7802 (2013.01); H01L 29/7813 (2013.01)

(58) Field of Classification Search
CPC .............. H01L 21/324; H01L 29/1608; H01L 29/511–513; H01L 29/518
See application file for complete search history.

(56) References Cited

U.S. PATENT DOCUMENTS 9,324,826 B2 * 4/2016 Shimizu ............ H01L 29/66068
2012/0199846 A1 8/2012 Shimizu et al.

FOREIGN PATENT DOCUMENTS

| JP | 2012-164788 | 8/2012 |
| JP | 2014-78727 | 5/2014 |

(Continued)

OTHER PUBLICATIONS

Ogasawara, M., et al. "Surface Reaction of 4H-SiC (1-100) with NO molecules analyzed by DFTB simulations", The 65th JSAP Spring Meeting Proceedings, 2018, 2 pages (with English Translation).

*Primary Examiner* — Daniel P Shook

(74) *Attorney, Agent, or Firm* — Oblon, McClelland, Maier & Neustadt, L.L.P.

(57) ABSTRACT

A semiconductor device according to an embodiment includes a silicon carbide layer; a gate electrode; a gate insulating layer provided between the silicon carbide layer and the gate electrode; and a region located between the silicon carbide layer and the gate insulating layer, the region having a first bonding structure, the first bonding structure including a threefold coordinated first nitrogen atom bonded to three first silicon atoms, a threefold coordinated second nitrogen atom bonded to three second silicon atoms, and a threefold coordinated third nitrogen atom bonded to three third silicon atoms, the first to third nitrogen atoms being adjacent to each other in the first bonding structure.

23 Claims, 15 Drawing Sheets

(56) References Cited

FOREIGN PATENT DOCUMENTS

| | | |
|---|---|---|
| JP | 5524103 | 6/2014 |
| JP | 2015-146450 | 8/2015 |
| JP | 5763154 | 8/2015 |
| JP | 6072122 | 2/2017 |

* cited by examiner

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2018-173110, filed on Sep. 14, 2018, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

A silicon carbide (SiC) is expected as a material for a next-generation semiconductor device. Silicon carbide has the characteristics that the bandgap of the silicon carbide is three times wider than that of silicon (Si), the breakdown field strength of the silicon carbide is about ten times higher than that of silicon, and the thermal conductivity of the silicon carbide is about three times higher than that of silicon. The use of the characteristics makes it possible to achieve a semiconductor device that has low loss and can operate at a high temperature.

However, for example, in a case in which a metal oxide semiconductor field effect transistor (MOSFET) is formed using silicon carbide, there is a problem that the mobility of carriers is reduced. It is considered that one of the causes of the reduction in the mobility of carriers is an interface state (surface state) present in an interface between a silicon carbide layer and a gate insulating layer.

DETAILED DESCRIPTION

Figure 1:
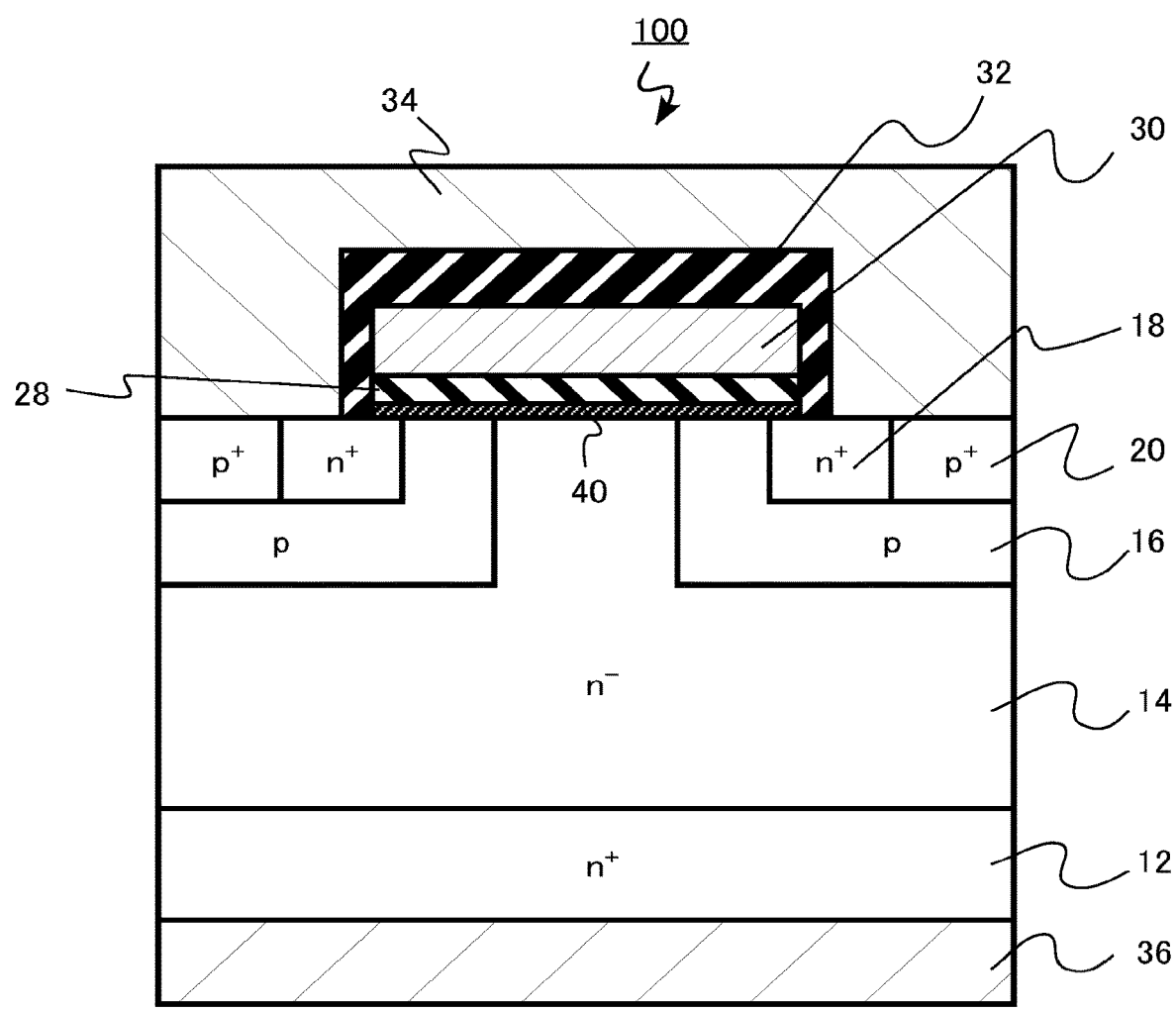
FIG. 1 is a cross-sectional view schematically illustrating a semiconductor device according to a first embodiment.

A semiconductor device according to an embodiment includes: a silicon carbide layer; a gate electrode; a gate insulating layer provided between the silicon carbide layer and the gate electrode; and a region located between the silicon carbide layer and the gate insulating layer, the region having a first bonding structure, the first bonding structure including a threefold coordinated first nitrogen atom bonded to three first silicon atoms, a threefold coordinated second nitrogen atom bonded to three second silicon atoms, and a threefold coordinated third nitrogen atom bonded to three third silicon atoms, the first to third nitrogen atoms being adjacent to each other in the first bonding structure.

Hereinafter, embodiments will be described with reference to the drawings. In the following description, for example, the same or similar members are denoted by the same reference numerals and the description of the members that have been described once will not be repeated.

In the following description, $n^+$, n, $n^-$, $p^+$, p, and $p^-$ indicate the relative levels of the impurity concentration of each conductivity type. That is, $n^+$ indicates an n-type impurity concentration higher than that of n and $n^-$ indicates an n-type impurity concentration lower than that of n. In addition, $p^+$ indicates a p-type impurity concentration higher than that of p and $p^-$ indicates a p-type impurity concentration lower than that of p. Further, in some cases, an $n^+$ type and an $n^-$ type are simply represented by an n type and a $p^+$ type and a $p^-$ type are simply represented by a p type.

First Embodiment

A semiconductor device according to a first embodiment includes a silicon carbide layer; a gate electrode; a gate insulating layer provided between the silicon carbide layer and the gate electrode; and a region located between the silicon carbide layer and the gate insulating layer, the region having a first bonding structure, the first bonding structure including a threefold coordinated first nitrogen atom bonded to three first silicon atoms, a threefold coordinated second nitrogen atom bonded to three second silicon atoms, and a threefold coordinated third nitrogen atom bonded to three third silicon atoms, the first to third nitrogen atoms being adjacent to each other in the first bonding structure.

Hereinafter, a case in which a gate insulating layer is made of silicon oxide will be described as an example.

FIG. 1 is a cross-sectional view schematically illustrating a semiconductor device according to a first embodiment. The semiconductor device according to the first embodiment is a MOSFET 100. The MOSFET 100 is a double implantation MOSFET (DIMOSFET) in which a p well and a source region are formed by ion implantation. In addition, the MOSFET 100 is an n-channel MOSFET having electrons as carriers.

The MOSFET 100 includes a silicon carbide substrate 12, a drift layer 14 (silicon carbide layer), a p well region 16 (silicon carbide layer), a source region 18, a p well contact region 20, a gate insulating layer 28, a gate electrode 30, an interlayer insulating film 32, a source electrode 34, a drain electrode 36, and an interface termination region 40 (region).

The silicon carbide substrate 12 is, for example, an n+ 4H—SiC substrate. The silicon carbide substrate 12 includes, for example, nitrogen (N) as n-type impurities. The n-type impurity concentration of the silicon carbide substrate 12 is, for example, equal to or greater than $1 \times 10^{18}$ cm$^{-3}$ and equal to or less than $1 \times 10^{20}$ cm$^{-3}$.

Figure 2:
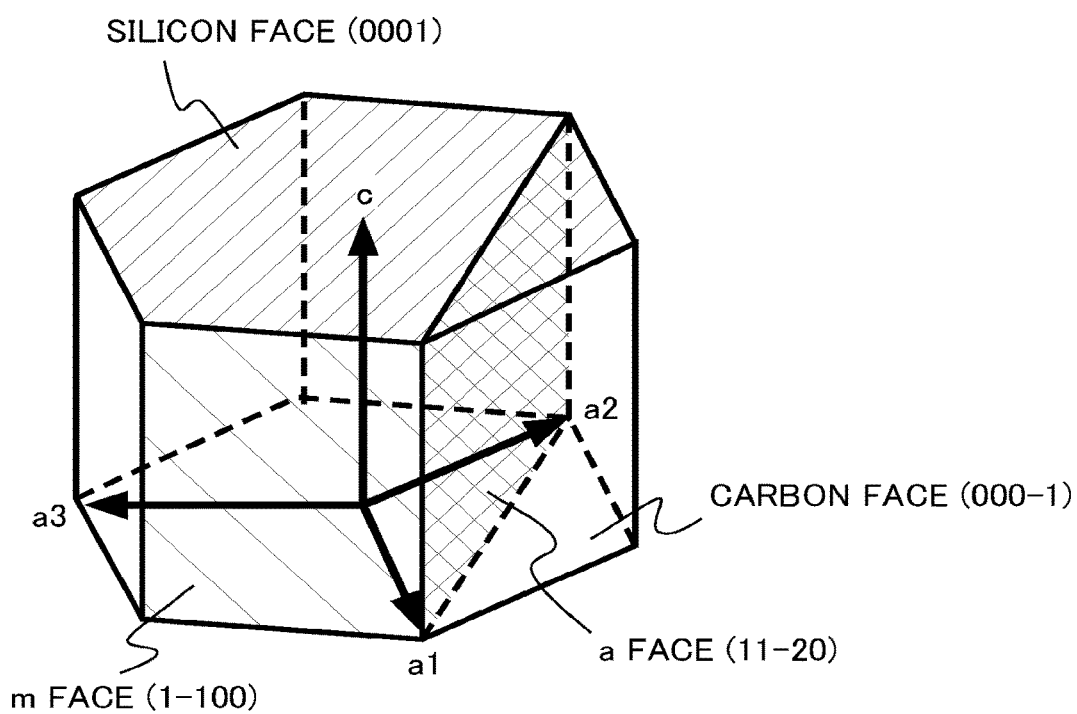
FIG. 2 is a diagram illustrating a crystal structure of a SiC semiconductor.

FIG. 2 is a diagram illustrating a crystal structure of a SiC semiconductor. The representative crystal structure of the SiC semiconductor is a hexagonal crystal system such as 4H—SiC. One of the faces (the top faces of the hexagonal prism) that have a c-axis along an axial direction of the hexagonal prism as a normal line is a (0001) face. A face equivalent to the (0001) face is referred to as a silicon face and is represented by a {0001} face. Silicon atoms (Si) are arranged on the outermost side of the silicon face.

The other of the faces (the top faces of the hexagonal prism) that have the c-axis along the axial direction of the hexagonal prism as a normal line is a (000-1) face. A face equivalent to the (000-1) face is referred to as a carbon face and is represented by a {000-1} face. Carbon atoms (C) are arranged in the outermost side of the carbon face.

A side face (prismatic face) of the hexagonal prism is an m face which is a face equivalent to a (1-100) face, that is, a {1-100} face. In addition, a face passing through a pair of ridge lines that are not adjacent to each other is an a face equivalent to a (11-20) face, that is, a {11-20} face. Both silicon atoms (Si) and carbon atoms (C) are arranged on the outermost sides of the m face and the a face.

Next, a case in which the inclination angle of a front surface of the silicon carbide substrate 12 with respect to the silicon face is equal to or greater than 0 degrees and equal to or less than 8 degrees and the inclination angle of a rear surface of the silicon carbide substrate 12 with respect to the carbon face is equal to or greater than 0 degrees and equal to or less than 8 degrees will be described as an example. An off angle between the surface of the silicon carbide substrate 12 and the silicon face is equal to or greater than 0 degrees and equal to or less than 8.

The drift layer 14 is provided on the surface of the silicon carbide substrate 12. The drift layer 14 is an n− silicon carbide layer. The drift layer 14 includes, for example, nitrogen as n-type impurities.

The n-type impurity concentration of the drift layer 14 is, for example, equal to or greater than $5 \times 10^{15}$ cm$^{-3}$ and equal to or less than $2 \times 10^{16}$ cm$^{-3}$. The drift layer 14 is, for example, a SiC epitaxial growth layer that is formed on the silicon carbide substrate 12 by epitaxial growth.

The inclination angle of a surface of the drift layer 14 with respect to the silicon face is also equal to or greater than 0 degrees and equal to or less than 8 degrees. The thickness of the drift layer 14 is, for example, equal to or greater than 5 μm and equal to or less than 100 μm.

The p well region 16 is provided on a portion of the surface of the drift layer 14. The p well region 16 is a p-type silicon carbide region. The p well region 16 includes, for example, aluminum (Al) as p-type impurities. The p-type impurity concentration of the p well region 16 is, for example, equal to or greater than $5 \times 10^{15}$ cm$^{-3}$ and equal to or less than $1 \times 10^{17}$ cm$^{-3}$.

The depth of the p well region 16 is, for example, equal to or greater than 0.4 μm and equal to or less than 0.8 μm. The p well region 16 functions as a channel region of the MOSFET 100.

The inclination angle of a surface of the p well region 16 with respect to the silicon face is also equal to or greater than 0 degrees and equal to or less than 8 degrees.

The source region 18 is provided on a portion of the surface of the p well region 16. The source region 18 is an n+ silicon carbide layer. The source region 18 includes, for example, phosphor (P) as n-type impurities. The n-type impurity concentration of the source region 18 is, for example, equal to or greater than $1 \times 10^{18}$ cm$^{-3}$ and equal to or less than $1 \times 10^{22}$ cm$^{-3}$ cm.

The depth of the source region 18 is less than the depth of the p well region 16. The depth of the source region 18 is, for example, equal to or greater than 0.2 μm and equal to or less than 0.4 μm.

The p well contact region 20 is provided on a portion of the surface of the p well region 16. The p well contact region 20 is provided on the side of the source region 18. The p well contact region 20 is a p+ silicon carbide region.

The p well contact region 20 includes, for example, aluminum as p-type impurities. The p-type impurity concentration of the p well contact region 20 is, for example, equal to or greater than $1 \times 10^{18}$ cm$^{-3}$ and equal to or less than $1 \times 10^{22}$ cm$^{-3}$.

The depth of the p well contact region 20 is less than the depth of the p well region 16. The depth of the p well contact region 20 is, for example, equal to or greater than 0.2 μm and equal to or less than 0.4 μm.

The gate insulating layer 28 is provided between the drift layer 14 and the gate electrode 30 and between the p well region 16 and the gate electrode 30. The gate insulating layer 28 is provided on the drift layer 14 and the p well region 16. The gate insulating layer 28 is continuously formed on the surfaces of the drift layer 14 and the p well region 16.

The gate insulating layer 28 is made of silicon oxide. The gate insulating layer 28 may be made of, for example, oxides other than silicon oxide or oxynitride. The gate insulating layer 28 may be made of, for example, aluminum oxide or silicon oxynitride.

The thickness of the gate insulating layer 28 is, for example, equal to or greater than 30 nm and equal to or less than 100 nm. The gate insulating layer 28 functions as a gate insulating layer of the MOSFET 100.

The interface termination region 40 is located between the drift layer 14 and the gate insulating layer 28 and between the p well region 16 and the gate insulating layer 28. The interface termination region 40 includes nitrogen (N) as a termination element that terminates a dangling bond.

Figure 3:
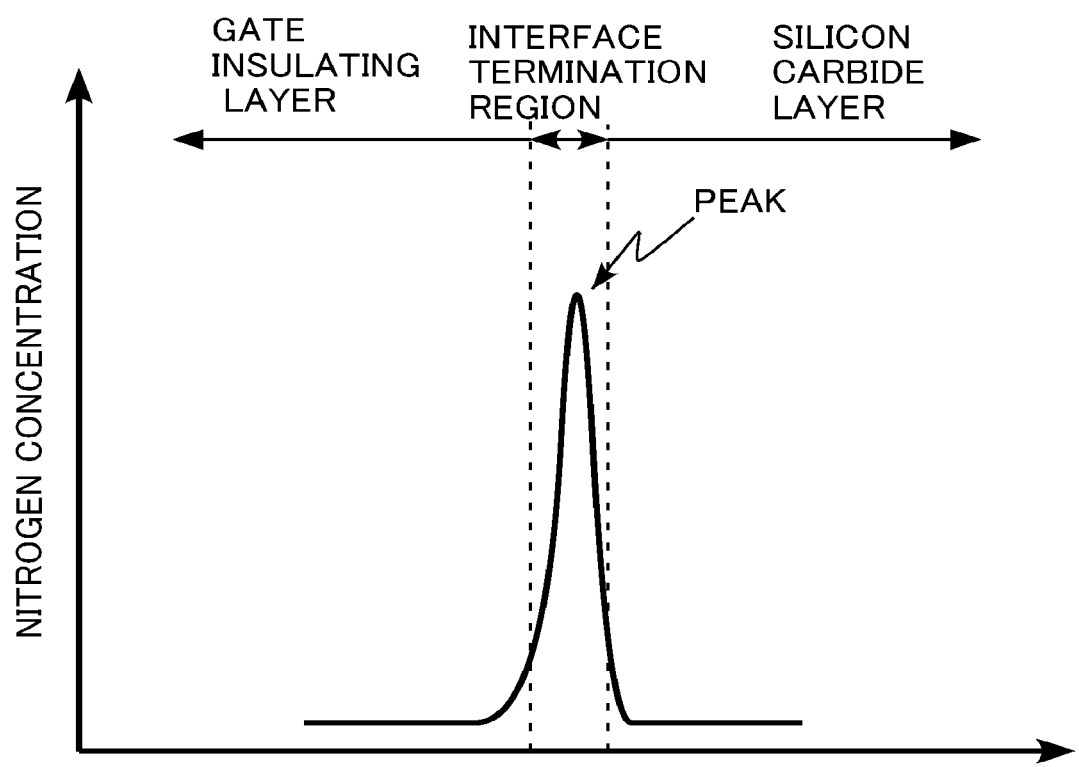
FIG. 3 is a diagram illustrating a nitrogen concentration distribution of the semiconductor device according to the first embodiment.

FIG. 3 is a diagram illustrating a nitrogen concentration distribution of the semiconductor device according to the first embodiment.

Nitrogen is segregated in an interface between the drift layer 14 and the gate insulating layer 28 and an interface between the p well region 16 and the gate insulating layer 28. The nitrogen concentration distribution has a peak in the interface termination region 40.

The full width at half maximum of a peak in the nitrogen concentration distribution is, for example, equal to or less than 1 nm. In addition, for example, the full width at half maximum of the peak in the nitrogen concentration distribution is preferably equal to or less than 0.25 nm and more preferably less than 0.2 nm.

Nitrogen substitutes a carbon atom in the surface layers of the drift layer 14 and the p well region 16. Nitrogen is threefold-coordinated with the silicon carbide layer. In other words, nitrogen is located at the position of a carbon atom in the crystal lattice of silicon carbide.

The nitrogen concentration of the peak in the nitrogen concentration distribution of the interface termination region 40 is, for example, equal to or greater than $1.2 \times 10^{19}$ cm$^{-3}$ and equal to or less than $2.4 \times 10^{22}$ cm$^{-3}$.

The concentration and distribution of nitrogen in the interface termination region 40 can be measured by, for example, secondary ion mass spectroscopy (SIMS).

The concentration of nitrogen in the gate insulating layer 28 and the silicon carbide layer is, for example, equal to or less than $2 \times 10^{16}$ cm$^{-3}$.

Figure 4A:
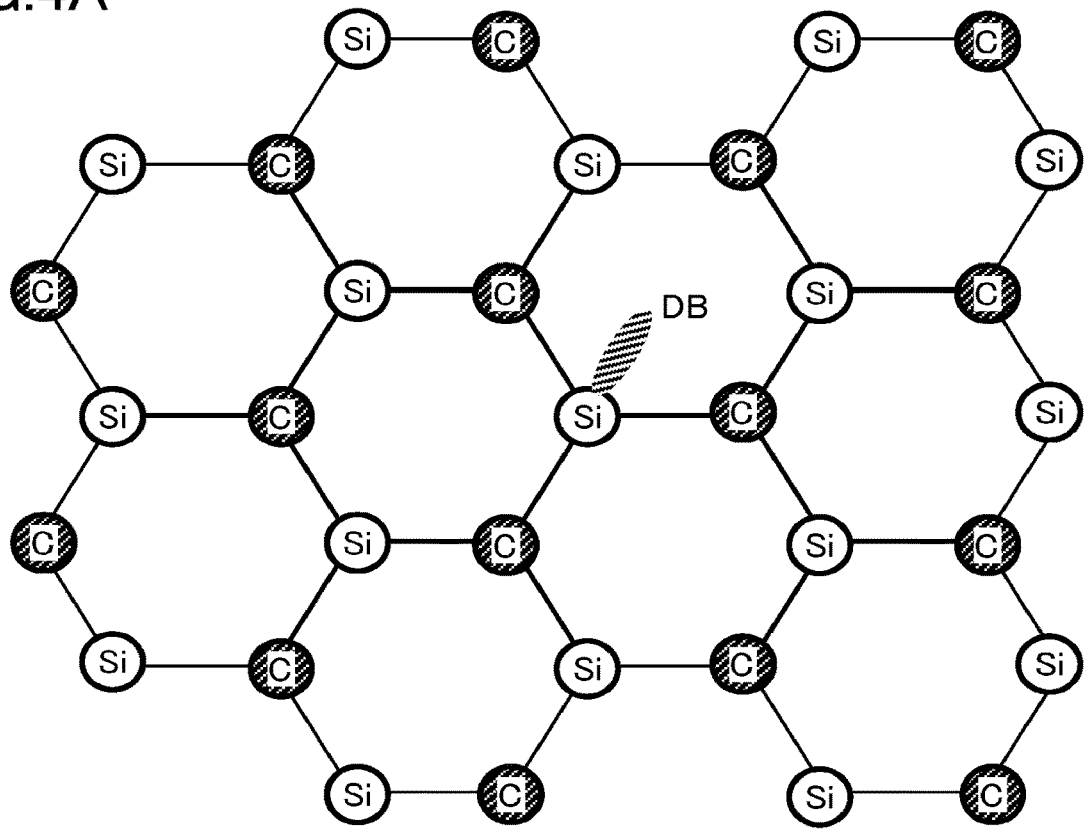
FIGS. 4A and 4B are diagrams illustrating an interface termination region of the semiconductor device according to the first embodiment.
Figure 4B:
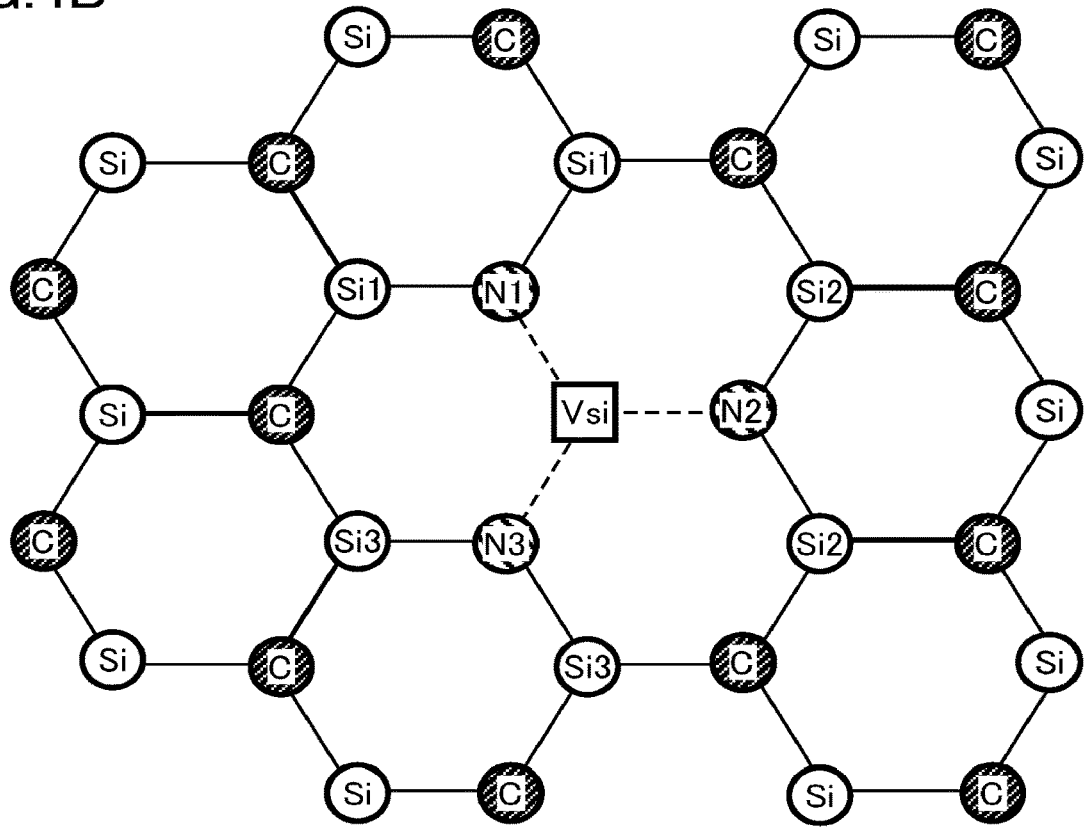

FIGS. 4A and 4B are diagrams illustrating the interface termination region of the semiconductor device according to the first embodiment. FIG. 4A is a diagram illustrating a silicon dangling bond. FIG. 4B is a diagram illustrating a bonding structure in which three threefold coordinated nitrogen atoms are adjacent to each other. FIGS. 4A and 4B are top views illustrating the silicon face of SiC. Silicon atoms (Si) are arranged in the outermost face and carbon atoms (C) are arranged below the silicon atoms.

As illustrated in FIG. 4A, for example, one silicon atom (Si) has a dangling bond (DB). The other silicon atoms (Si) are bonded to, for example, oxygen atoms in silicon oxide (not illustrated).

The interface termination region 40 according to the first embodiment includes a first bonding structure illustrated in FIG. 4B. The interface termination region 40 according to the first embodiment includes the first bonding structure in which three threefold coordinated nitrogen atoms are adjacent to each other.

The first bonding structure includes a threefold coordinated first nitrogen atom (N1) bonded to three first silicon atoms (Si1), a threefold coordinated second nitrogen atom (N2) bonded to three second silicon atoms (Si2), and a threefold coordinated third nitrogen atom (N3) bonded to three third silicon atoms (Si3).

The first nitrogen atom (N1), the second nitrogen atom (N2), and the third nitrogen atom (N3) are adjacent to each other. The first nitrogen atom (N1), the second nitrogen atom (N2), and the third nitrogen atom (N3) are not directly bonded to each other.

A distance between the first nitrogen atom (N1) and the second nitrogen atom (N2) is substantially equal to a distance between the first nitrogen atom (N1) and a carbon atom closest to the first nitrogen atom (N1). Similarly, a distance between the second nitrogen atom (N2) and the third nitrogen atom (N3) is substantially equal to a distance between the second nitrogen atom (N2) and a carbon atom closest to the second nitrogen atom (N2). Similarly, a distance between the third nitrogen atom (N3) and the first nitrogen atom (N1) is substantially equal to a distance between the third nitrogen atom (N3) and a carbon atom closest to the third nitrogen atom (N3).

In FIG. 4B, one of the three first silicon atoms (Si1), one of the three second silicon atoms (Si2), and one of the three third silicon atoms (Si3) are not illustrated. These silicon atoms are present immediately below the first nitrogen atom (N1), the second nitrogen atom (N2), and the third nitrogen atom (N3) in the depth direction of the plane of paper.

The first bonding structure is obtained by substituting three carbon atoms bonded to the silicon atom having the dangling bond illustrated in FIG. 4A with threefold coordinated nitrogen atoms. The position of the silicon atom having the dangling bond becomes a silicon hole (Vsi).

Figure 5A:
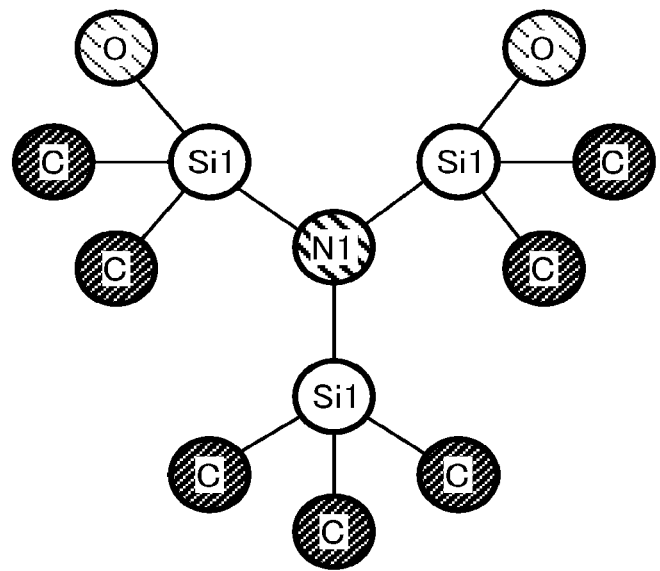
FIGS. 5A and 5B are diagrams illustrating a first bonding structure of the semiconductor device according to the first embodiment.
Figure 5B:
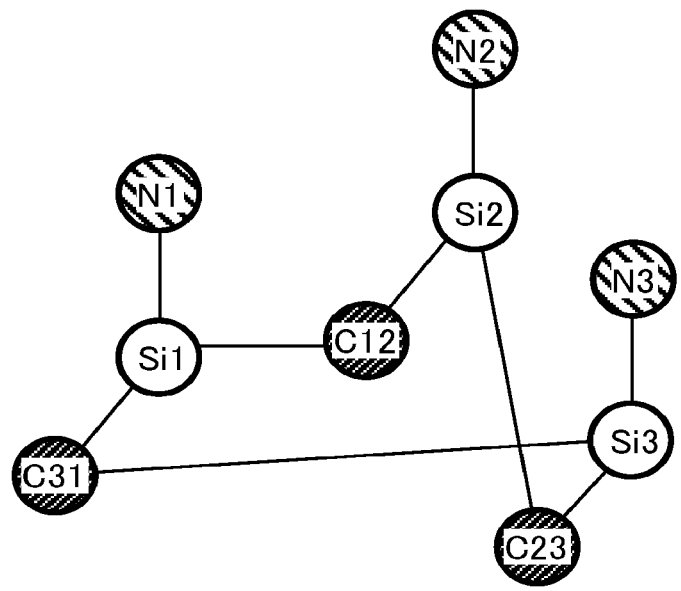

FIGS. 5A and 5B are diagrams illustrating the first bonding structure of the semiconductor device according to the first embodiment. FIG. 5A is a diagram illustrating the bonding state of the first nitrogen atom (N1). FIG. 5B is a diagram schematically illustrating the bonding state of the first nitrogen atom (N1), the second nitrogen atom (N2), and the third nitrogen atom (N3). In FIGS. 5A and 5B, the bonding of some atoms is not illustrated.

In FIGS. 5A and 5B, the distances of the first nitrogen atom (N1), the second nitrogen atom (N2), and the third nitrogen atom (N3) from the surface of the silicon carbide layer are equal to each other. The distances of the first silicon atom (Si1), the second silicon atom (Si2), and the third silicon atom (Si3) from the surface of the silicon carbide layer are equal to each other. The distances of the carbon atom (C12), the carbon atom (C23), and the carbon atom (C31) from the surface of the silicon carbide layer are equal to each other.

In the first bonding structure, as illustrated in FIG. 5A, at least one of three first silicon atoms (Si1) is bonded to an oxygen atom (O). At least one of three second silicon atoms (Si2) and at least one of three third silicon atoms (Si3) are bonded to oxygen atoms (O).

In other words, at least one of the second closest atoms to the first nitrogen atom (N1) is an oxygen atom (O). At least one of the second closest atoms to the second nitrogen atom (N2) is an oxygen atom (O). At least one of the second closest atoms to the third nitrogen atom (N3) is an oxygen atom (O). The oxygen atoms (O) are included in the silicon oxide of the gate insulating layer 28.

As illustrated in FIG. 5B, in the first bonding structure, any one of three first silicon atoms (Si1) and any one of three second silicon atoms (Si2) are bonded to the same carbon atom (C12). Similarly, any one of three second silicon atom (Si2) and any one of three third silicon atoms (Si3) are bonded to the same carbon atom (C23). Similarly, any one of three third silicon atoms (Si3) and any one of three first silicon atoms (Si1) are bonded to the same carbon atom (C31).

Whether the first bonding structure is present in the interface termination region 40 can be determined by, for example, X-ray photoelectron spectroscopy (XPS).

The gate electrode 30 is provided above the gate insulating layer 28. The gate insulating layer 28 is interposed between the gate electrode 30 and the drift layer 14.

Polysilicon including, for example, n-type impurities or p-type impurities can be applied to the gate electrode 30.

The interlayer insulating film 32 is formed on the gate electrode 30. The interlayer insulating film 32 is, for example, a silicon oxide film.

The source electrode 34 is electrically connected to the source region 18 and the p well contact region 20. The source electrode 34 also functions as a p well electrode that applies potential to the p well region 16.

The source electrode 34 has, for example, a stacked structure of a nickel (Ni) barrier metal layer and an aluminum metal layer formed on the barrier metal layer. The nickel barrier metal layer and the silicon carbide layer may react to form nickel silicide (for example, NiSi or Ni$_2$Si). The nickel barrier metal layer and the aluminum metal layer may react to form an alloy.

The drain electrode 36 is provided on a side of the silicon carbide substrate 12 which is opposite to the drift layer 14, that is, on a rear surface of the silicon carbide substrate 12. The drain electrode 36 is made of, for example, nickel. Nickel may react with the silicon carbide substrate 12 to form nickel silicide (for example, NiSi or Ni$_2$Si).

In the first embodiment, the n-type impurities are, for example, nitrogen or phosphor. Arsenic (As) or antimony (Sb) may be applied as the n-type impurities.

In addition, in the first embodiment, the p-type impurities are, for example, aluminum. Boron (B), gallium (Ga), or indium (In) may be applied as the p-type impurities.

Next, a method for manufacturing the semiconductor device according to the first embodiment will be described.

In the semiconductor device manufacturing method according to the first embodiment, a gate insulating layer is formed on a silicon carbide layer. A first heat treatment that irradiates the gate insulating layer with atomic hydrogen (H) generated by a heated catalyzer method is performed in a nitrogen atmosphere of 1000° C. or higher. A gate electrode is formed on the gate insulating layer.

Figure 6:
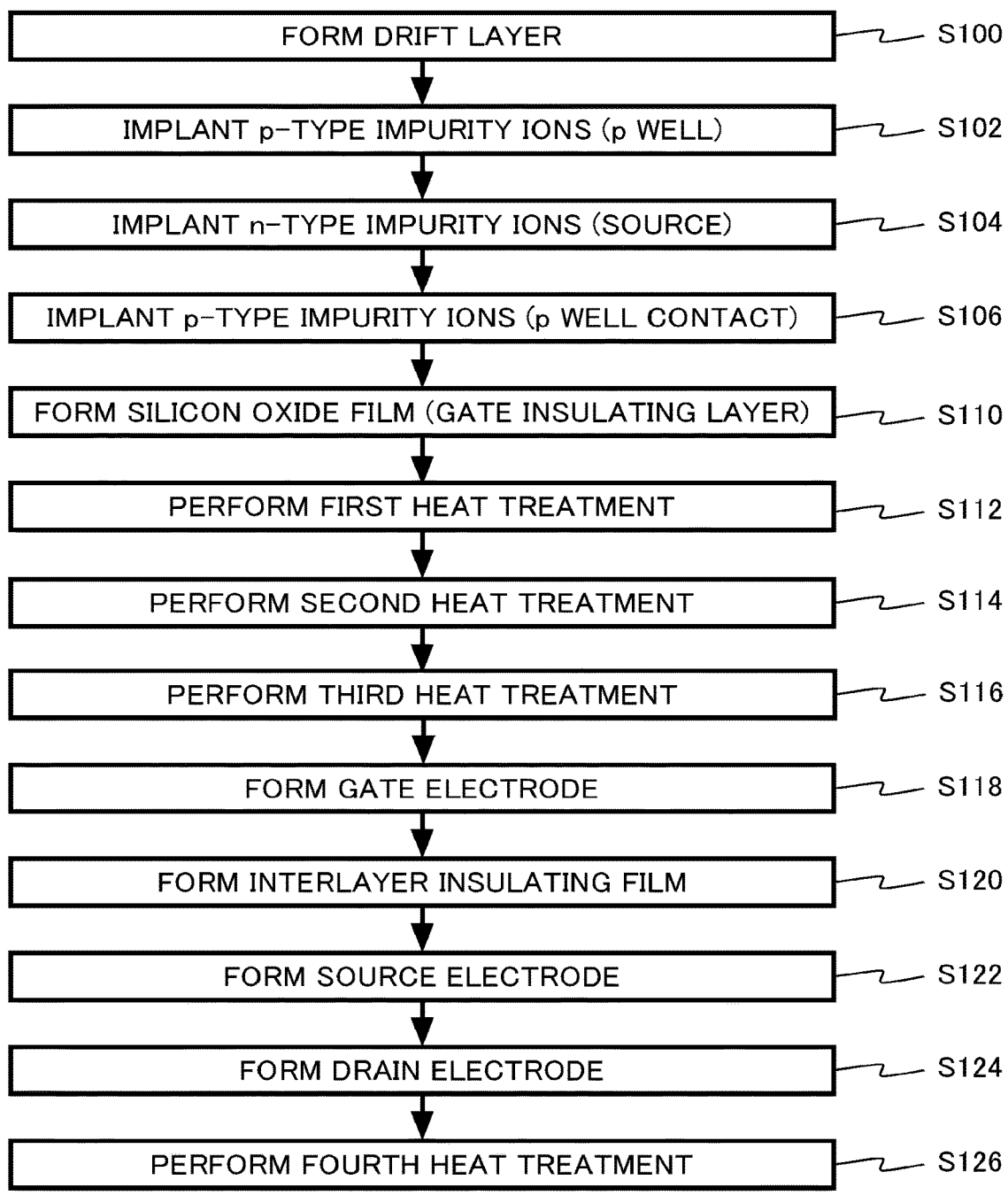
FIG. 6 is a process flowchart illustrating a method for manufacturing the semiconductor device according to the first embodiment.

FIG. 6 is a process flowchart illustrating the semiconductor device manufacturing method according to the first embodiment.

As illustrated in FIG. 6, the semiconductor device manufacturing method according to the first embodiment includes the formation of a drift layer (Step S100), p-type impurity ion implantation (Step S102), n-type impurity ion implantation (Step S104), p-type impurity ion implantation (Step S106), the formation of a silicon oxide film (Step S110), a first heat treatment (Step S112), a second heat treatment (Step S114), a third heat treatment (Step S116), the formation of a gate electrode (Step S118), the formation of an interlayer insulating film (Step S120), the formation of a source electrode (Step S122), the formation of a drain electrode (Step S124), and a fourth heat treatment (Step S126).

First, the n$^+$ silicon carbide substrate 12 is prepared. The silicon carbide substrate 12 is made of, for example, 4H—SiC. The silicon carbide substrate 12 is, for example, a silicon carbide wafer.

The silicon carbide substrate 12 includes nitrogen as n-type impurities. The n-type impurity concentration of the silicon carbide substrate 12 is, for example, equal to or greater than $1 \times 10^{18}$ cm$^{-3}$ and equal to or less than $1 \times 10^{20}$ cm$^{-3}$. The thickness of the silicon carbide substrate 12 is, for example, 350 μm. The silicon carbide substrate 12 may be thinned to about 90 μm before the drain electrode 36 is formed on the rear surface.

In Step S100, the drift layer 14 is formed on the silicon face of the silicon carbide substrate 12 by an epitaxial growth method. The drift layer 14 is made of 4H—SiC.

The drift layer 14 includes nitrogen as n-type impurities. The n-type impurity concentration of the drift layer 14 is, for example, equal to or greater than $5 \times 10^{15}$ cm$^{-3}$ and equal to or less than $2 \times 10^{16}$ cm$^{-3}$. The thickness of the drift layer 14 is, for example, equal to or greater than 5 μm and equal to or less than 100 μm.

In Step S102, first, a first mask member is formed by patterning using photolithography and etching. Then, aluminum ions which are p-type impurity ions are implanted into the drift layer 14, using the first mask member as an ion implantation mask. The p well region 16 is formed by the ion implantation.

In Step S104, first, a second mask member is formed by patterning using photolithography and etching. Then, nitrogen ions which are n-type impurity ions are implanted into the drift layer 14, using the second mask member as an ion implantation mask, to form the source region 18.

In Step S106, a third mask member is formed by patterning using photolithography and etching. Then, aluminum ions which are p-type impurity ions are implanted into the drift layer 14, using the third mask member as an ion implantation mask, to form the p well contact region 20.

In Step S110, a silicon oxide film is formed on the silicon carbide layer. The silicon oxide film becomes the gate insulating layer 28.

The silicon oxide film is a deposited film that is formed by, for example, a chemical vapor deposition method (CVD) or a physical vapor deposition method (PVD). The thickness of the silicon oxide film is, for example, equal to or greater than 20 nm and equal to or less than 100 nm.

The silicon oxide film is, for example, a silicon oxide film that is formed by a CVD method using tetraethyl orthosilicate (TEOS) as source gas.

In Step S112, the first heat treatment is performed. The first heat treatment is performed in a non-oxidizing nitrogen atmosphere. The first heat treatment is annealing using nitrogen gas.

In addition, in Step S112, the silicon oxide film is irradiated with atomic hydrogen (H) generated by a heated catalyzer method at the same time as annealing using nitrogen gas is performed. The atomic hydrogen (H) generated by the heated catalyzer method is introduced into the silicon oxide film.

In the heated catalyzer method, hydrogen gas is introduced into a heated tungsten filament. The dissociative absorption of hydrogen molecules on the tungsten filament occurs. Then, the atomic hydrogen is thermally desorbed from the tungsten filament. The heating temperature of the tungsten filament is, for example, 1600° C.

The heated catalyzer method is an atomic element generation method that causes thermal dissociation using a metal filament for thermal dissociation. The heated catalyzer method can dissociate fluorine molecules, hydrogen molecules, and deuterium molecules into fluorine atoms, hydrogen atoms, and deuterium atoms, respectively. The metal filament is, for example, tungsten, molybdenum, iron chromium, rhenium, or thorium.

The first bonding structure is formed at the interface between the p well region 16 and the first silicon oxide film by the first heat treatment. The silicon atom (Si) having the dangling bond (DB) is removed by the first heat treatment. The silicon atom (Si) having the dangling bond (DB) is emitted from the silicon carbide layer by the first heat treatment.

A carbon atom substituted with a nitrogen atom is bonded to atomic hydrogen, becomes hydrocarbon (CHx), and is emitted from the silicon carbide layer by the first heat treatment. Hydrocarbon (CHx) is, for example, methane (CH$_4$).

The first heat treatment also functions as silicon oxide film densification annealing. The silicon oxide film is changed to a dense film by the first heat treatment.

The temperature of the first heat treatment is, for example, equal to or greater than 1000° C. and equal to or less than 1500° C. The temperature is preferably equal to or greater than 1100° C. and equal to or less than 1400° C. and is more preferably equal to or greater than 1200° C. and equal to or less than 1300° C.

The reactivity of nitrogen is increased by the inclusion of atomic hydrogen (H). However, in a case in which the temperature of the first heat treatment is less than 1000° C., the reactivity is not obtained. It is preferable that the temperature of the first heat treatment is high in terms of the reactivity of nitrogen. In contrast, in a case in which the temperature of the first heat treatment is greater than 1500° C., there is a concern that the insulating film will be damaged. In addition, there is a concern that the carbon deficiency of the silicon carbide layer will increase. It is preferable that the temperature of the first heat treatment is low from these points of view. It is necessary to optimize the two factors. Typically, the first heat treatment is performed at a temperature that is equal to or greater than 1200° C. and equal to or less than 1300° C.

In Step S114, the second heat treatment is performed. The second heat treatment is performed in an oxidizing atmosphere at a temperature that is equal to or greater than 750° C. and equal to or less than 900° C.

In a case in which the silicon atom (Si) emitted from the silicon carbide layer by the first heat treatment remains independently in the gate insulating layer 28, there is a concern that an energy level which will be a charge trap will be generated in the gate insulating layer 28. The second heat treatment oxidizes the silicon atom (Si) emitted from the silicon carbide layer so as to be harmless.

It is important that the SiC substrate is not oxidized. That is, the second heat treatment certainly oxidizes the silicon atom (Si) emitted from the silicon carbide layer and does not oxidize the SiC substrate.

The second heat treatment is performed, for example, in an atmosphere in which oxygen partial pressure is equal to or greater than 0.1% and equal to or less than 2%. The second heat treatment is preferably performed in an atmosphere in which oxygen partial pressure is equal to or greater than 0.5% and equal to or less than 1%. In a case in which the oxygen partial pressure is less than 0.1%, there is a concern that it will be difficult to oxidize surplus silicon. On the other hand, in a case in which the oxygen partial pressure is greater than 2%, there is a concern that the interface will be oxidized.

It is preferable that the second heat treatment is performed at a lower temperature as the oxygen partial pressure becomes higher and is performed at a higher temperature as the oxygen partial pressure becomes lower. Preferably, the temperature of the second heat treatment is equal to or greater than 800° C. and equal to or less than 900° C. in the Si face and is equal to or greater than 750° C. and equal to or less than 850° C. in the m face. Typically, in the Si face, the oxygen partial pressure is 1% and the treatment temperature is 850° C. In the m face, the oxygen partial pressure is 1% and the treatment temperature is 800° C.

Since the first bonding structure is formed in the surface of the silicon carbide layer, the oxidation of the silicon carbide layer is unlikely to progress. Therefore, the diffusion of surplus carbon into the gate insulating layer 28 due to oxidation is suppressed.

In Step S116, the third heat treatment is performed. The third heat treatment is performed in a non-oxidizing atmosphere at a temperature that is lower than that in the first heat treatment. For example, annealing is performed under the condition of a temperature that is equal to or greater than 900° C. and equal to or less than 1200° C. in a nitrogen gas atmosphere.

The non-oxidizing atmosphere is an atmosphere in which annealing is performed in at least one gas selected from nitrogen gas, argon gas, and helium gas. Oxygen concentration in the third heat treatment is preferably equal to or less than 100 ppm and is more preferably equal to or less than 10 ppm. As the treatment temperature of the third heat treatment becomes higher, the limitation of the oxygen concentration becomes stricter. The oxygen concentration is preferably equal to or less than 1 ppm at 1200° C. The oxygen concentration is more preferably equal to or less than 10 ppm at 1000° C.

In a case in which hydrocarbon (CHx) generated by the first heat treatment remains in the gate insulating layer 28, there is a concern that an energy level which will be a charge trap will be generated in the gate insulating layer 28. The hydrocarbon (CHx) is diffused to the outside of the gate insulating layer 28 by the third heat treatment.

It is possible to diffuse almost all CHx to the outside in principle by performing the third heat treatment for enough time. In a case in which the third heat treatment is performed at a temperature of lower than 900° C., there is a concern that diffusion will be insufficient. In contrast, in a case in which the third heat treatment is performed at a temperature of higher than 1200° C. for a long time, there is a concern that the insulating film or the silicon carbide layer will start to be damaged. In particular, it is preferable that oxygen partial pressure is sufficiently low in order to suppress the oxidation of the silicon carbide layer. It is preferable that the temperature of the third heat treatment is high in order to sufficiently diffuse hydrocarbon (CHx). Typically, the third heat treatment is performed at 1200° C. and an oxygen partial pressure of 1 ppm or less.

In Step S118, the gate electrode 30 is formed on the gate insulating layer 28. The gate electrode 30 is made of, for example, polysilicon including n-type impurities or p-type impurities.

In Step S120, the interlayer insulating film 32 is formed on the gate electrode 30. The interlayer insulating film 32 is, for example, a silicon oxide film.

In Step S122, the source electrode 34 is formed. The source electrode 34 is formed on the source region 18 and the p well contact region 20. The source electrode 34 is formed by, for example, sputtering nickel (Ni) and aluminum (Al).

In Step S124, the drain electrode 36 is formed. The drain electrode 36 is formed on the rear surface of the silicon carbide substrate 12. The drain electrode 36 is formed by, for example, sputtering nickel.

In Step S126, the fourth heat treatment is performed. The fourth heat treatment is performed, for example, in an argon gas atmosphere at a temperature that is equal to or greater than 400° C. and equal to or less than 1000° C. The contact resistance of the source electrode 34 and the drain electrode 36 is reduced by the fourth annealing.

The MOSFET 100 illustrated in FIG. 1 is formed by the above-mentioned manufacturing method.

Next, the function and effect of the semiconductor device according to the first embodiment will be described.

In a case in which a MOSFET is formed using silicon carbide, there is a problem that the mobility of carriers is reduced. It is considered that one of the causes of the reduction in the mobility of carriers is an interface state (surface state) between a silicon carbide layer and a gate insulating layer. It is considered that the interface state occurs due to a dangling bond present in a surface of the silicon carbide layer.

The MOSFET 100 according to the first embodiment includes the interface termination region 40 between the silicon carbide layer and the gate insulating layer 28. The first bonding structure is formed in the interface termination region 40 and dangling bonds are reduced. Therefore, a MOSFET in which a reduction in the mobility of carriers is suppressed is achieved. Hereinafter, this will be described in detail.

Figure 7A:
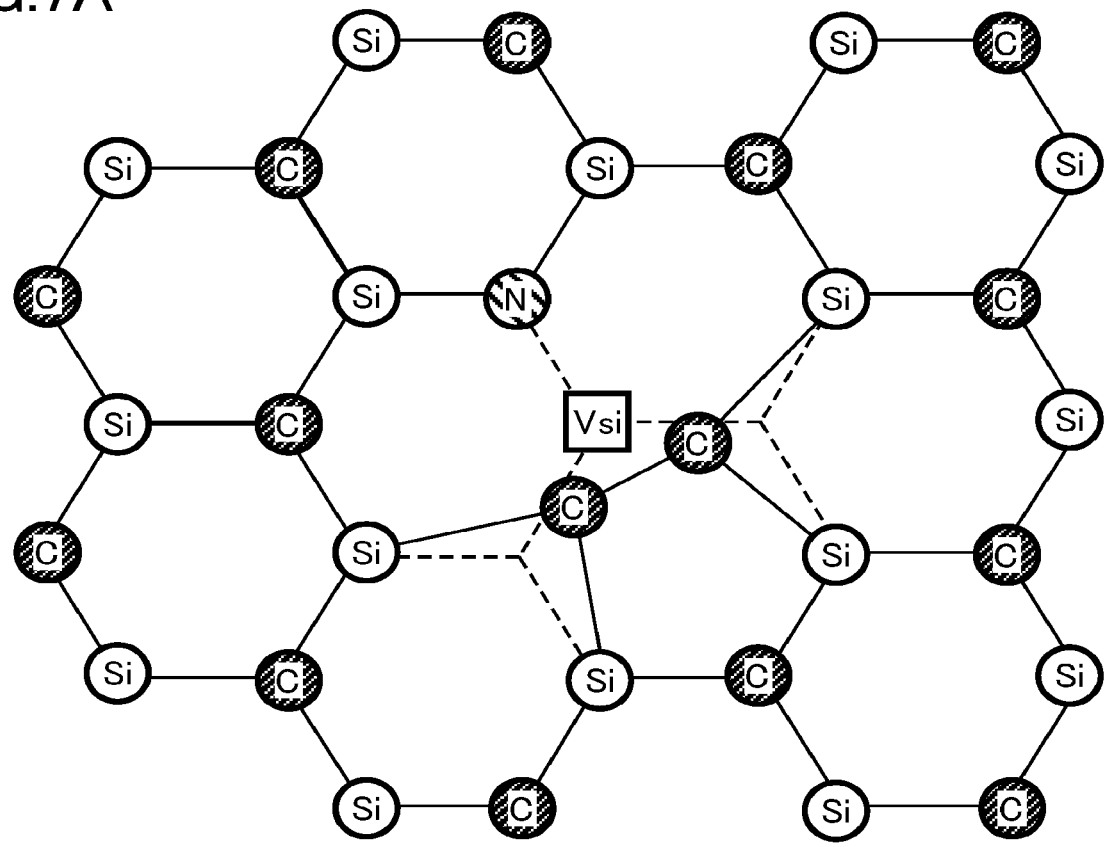
FIGS. 7A and 7B are diagrams illustrating an interface termination region of a semiconductor device according to a comparative example.
Figure 7B:
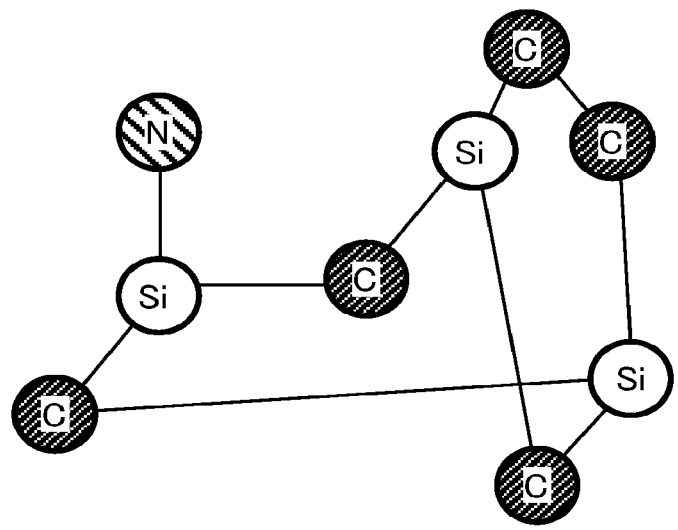

FIGS. 7A and 7B are diagrams illustrating an interface termination region of a semiconductor device according to a comparative example. FIG. 7A is a diagram illustrating a second bonding structure including one threefold coordinated nitrogen atom. FIG. 7A is a top view illustrating a silicon face of SiC. FIG. 7B is a diagram schematically illustrating a bonding state of the second bonding structure.

The interface termination region of the semiconductor device according to the comparative example is formed by, for example, a manufacturing method using nitric oxide (NO). In this case, the second bonding structure is mainly formed in the interface termination region.

For example, in a case in which C1s spectrum analysis is performed by XPS, the σ bond between C and C is found and the absolute amount of the σ bond can be measured.

The second bonding structure is obtained by substituting one of three carbon atoms bonded to the silicon atom having the dangling bond illustrated in FIG. 4A with a threefold coordinated nitrogen atom. The σ bond between the remaining two carbon atoms is formed and the second bonding structure is stabilized.

The dangling bond of the silicon atom is removed by the formation of the second bonding structure. The position of the silicon atom having the dangling bond becomes a silicon hole (Vsi).

In the second bonding structure, a threefold coordinated nitrogen atom and two carbon atoms bonded to each other are adjacent to each other. The threefold coordinated nitrogen atom is not directly bonded to the two carbon atoms.

The dangling bond of the silicon atom is removed by the second bonding structure. However, a Si—C distance between the carbon atom and Si bonded to the carbon atom is increased by the σ bond between two carbon atoms in the second bonding structure. As a result, the first principle calculation of the inventors proved that an energy level could be generated in the bandgap of the insulating film. The energy level may cause a variation in the threshold voltage of a MOSFET.

In addition, in the interface nitrogen termination (for example, a NO treatment or a $N_2O$ treatment) accompanied by oxidation, in a case in which a N1s peak of XPS is measured, a $NSi_2O$ peak or a $NSiO_2$ peak appears in addition to a $NSi_3$ peak. This is because oxidation is more likely to occur than nitridation by triple digits. That is, nitridation and oxidation occur equally only in a case in which oxygen concentration is lowered by triple digits. However, in oxynitridation according to the related art, oxidation is very strong and a peak related to oxygen appears along with the $NSi_3$ peak.

A $NSi_2O$ structure in which two silicon atoms and one oxygen atom are bonded to a nitrogen atom or a $NSiO_2$ structure in which one silicon atom and two oxygen atoms are bonded to a nitrogen atom has a N—O bond, is in a SiC gap, and is an origin causing the degradation of mobility or a variation in threshold voltage. Therefore, this state needs to be eliminated as much as possible. However, it is difficult to eliminate this state in the interface termination method (NO processing or $N_2O$ processing) according to the related art.

In contrast, in the method according to the first embodiment, oxidation is not actively used and hydrogen is used to extract carbon in the surface of the substrate. Therefore, according to the method of the first embodiment, in a case in which the N1s peak of XPS is measured, only the $NSi_3$ peak appears and the $NSi_2O$ peak or the $NSiO_2$ peak does not appear. That is, the $NSi_2O$ peak and the $NSiO_2$ peak are equal to or less than the measurement limit.

For example, the nitrogen concentration of the peak in the nitrogen concentration distribution of the interface termination region 40 is equal to or greater than $1.2 \times 10^{19}$ cm$^{-3}$ and equal to or less than $2.4 \times 10^{22}$ cm$^{-3}$.

In the related art, the density of $NSi_2O$ is less than 10% of nitrogen concentration. That is, the density of $NSi_2O$ is equal to or greater than $1.2 \times 10^{18}$ cm$^{-3}$ and equal to or less than $2.4 \times 10^{21}$ cm$^{-3}$. The density of $NSi_2O$ is an amount of $NSi_2O$ in a certain volume. However, in the first embodiment, the density of $NSi_2O$ is less than $1.2 \times 10^{17}$ cm$^{-3}$. In a case in which an interface is formed, oxygen is not involved. Therefore, the density of $NSi_2O$ is equal to or less than the measurement limit. The density of $NSi_2O$ depends on the accuracy of measurement and is less than $1.2 \times 10^{17}$ cm$^{-3}$. In a case in which high-accuracy measurement spending enough time is performed, the density of $NSi_2O$ is less than $1.2 \times 10^{16}$ cm$^{-3}$.

The first principle calculation of the inventors proved that the first bonding structure was stably present in the surface of the silicon carbide layer. The first bonding structure is obtained by substituting three carbon atoms bonded to a silicon atom having a dangling bond with threefold coordinated nitrogen atoms. Therefore, dangling bonds are reduced in the surface of the silicon carbide layer. As a result, an interface state is reduced and a reduction in the mobility of carriers in the MOSFET 100 is suppressed.

The first bonding structure in which three threefold coordinated nitrogen atoms are adjacent to each other is very stable. Therefore, even while the MOSFET 100 is operating, the possibility that the structure will be broken is very low. As a result, the MOSFET 100 with high reliability is achieved.

For example, in interface termination using a treatment with nitric oxide (NO), the silicon carbide layer is oxidized at the same time as nitrogen reacts with the silicon carbide layer. In order for nitrogen to react with the silicon carbide layer, it is necessary to find an optimum solution in the conflict between the nitridation of the silicon carbide layer and the oxidation of the silicon carbide layer. In a case in which oxidation occurs, the silicon carbide layer is oxidized, which makes it difficult to form the first bonding structure.

The first principle calculation of the inventors proved that it was possible to accelerate the nitridation of the silicon carbide layer, using hydrogen atoms instead of oxygen. It was examined to nitride the silicon carbide layer using hydrogen atoms, without using any oxygen. It was found that the silicon carbide layer could be nitrided using carbon bonded to the silicon dangling bond. As a result, it was found that the first bonding structure appeared as the most stable structure.

In the MOSFET 100 according to the first embodiment, in the interface termination region 40, a density of first bonding structures is larger than a density of second bonding structures. A density of the first bonding structures is an amount of the first bonding structures in a certain volume. A density of the second bonding structures is an amount of the second bonding structures in a certain volume. Therefore, a variation in the threshold voltage of the MOSFET 100 is suppressed and the MOSFET 100 with high reliability is achieved.

In the interface termination region 40 of the MOSFET 100 according to the first embodiment, the density of the second bonding structure is, for example, less than $1.2 \times 10^{18}$ cm$^{-3}$. The density of the second bonding structure is, for example, less than $1.2 \times 10^{17}$ cm$^{-3}$. The density of the second bonding structure is, for example, less than $1.2 \times 10^{16}$ cm$^{-3}$.

The magnitude relationship between the density of first bonding structure and the density of second bonding structure in the interface termination region 40 or the density of first and second bonding structures can be determined or measured by, for example, XPS.

In the method for manufacturing the MOSFET 100 according to the first embodiment, in Step S112, the first bonding structure can be formed using atomic hydrogen in a non-oxidizing atmosphere. Therefore, the generation of surplus carbon that generates a harmful energy level in the gate insulating layer 28 is suppressed.

The carbon atom that is substituted with a nitrogen atom and is emitted from the silicon carbide layer is changed to hydrocarbon (CHx) by the use of atomic hydrogen. Therefore, the hydrocarbon (CHx) can be easily diffused to the outside of the gate insulating layer 28.

Therefore, a harmful energy level in the gate insulating layer 28 is reduced and it is possible to form a MOSFET with high reliability. In addition, the use of atomic hydrogen makes it possible to form the first bonding structure with high efficiency.

In addition, the formation of the second bonding structure in the interface termination region 40 is suppressed by the use of atomic hydrogen and the amount of first bonding structure can be larger than the amount of second bonding structure.

Further, the use of atomic hydrogen makes it possible to decompose the second bonding structure and to convert the second bonding structure into the first bonding structure in a case in which enough time is given. Therefore, it is possible to convert all of the second bonding structures into the first bonding structures in a case in which enough time is given. As a result, the density of the second bonding structure can be less than 10% of the density of the first bonding structure at most and may be less than 1% of the concentration of the first bonding structure.

The density of the second bonding structure depends on the accuracy of measurement and is less than $1.2 \times 10^{17}$ cm$^{-3}$. In a case in which high-accuracy measurement spending enough time is performed, the density of the second bonding structure is less than $1.2 \times 10^{16}$ cm$^{-3}$.

The off angle between a surface of the silicon carbide layer which faces the gate insulating layer 28 and the silicon face is preferably equal to or less than 4 degrees and is more preferably equal to or less than 2 degrees in order to suppress a reduction in the mobility of carriers in the MOSFET 100.

As described above, according to the first embodiment, dangling bonds are reduced in the surface of the silicon carbide layer. Therefore, a reduction in the mobility of carriers in a MOSFET is suppressed. In addition, it is possible to achieve a MOSFET with high reliability.

Second Embodiment

A semiconductor device according to a second embodiment includes: a silicon carbide layer; a gate electrode; a gate insulating layer provided between the silicon carbide layer and the gate electrode; and a region located between the silicon carbide layer and the gate insulating layer, a spectrum of the region obtained by X-ray photoelectron spectroscopy having a first peak and a second peak, the first peak caused by a threefold coordinated first nitrogen atom bonded to three first silicon atoms, the first peak having first binding energy and first intensity, the second peak caused by a threefold coordinated second nitrogen atom bonded to three second silicon atoms, the second peak having second binding energy higher than the first binding energy and second intensity. An off angle between a surface of the silicon carbide layer facing the gate insulating layer and an m face is equal to or less than 8 degrees.

The semiconductor device according to the second embodiment differs from the semiconductor device according to the first embodiment in that it is a trench gate MOSFET having a gate electrode provided in a trench. In addition, the second embodiment differs from the first embodiment in that an off angle between the surface of the silicon carbide layer which faces the gate insulating layer and the m face is equal to or less than 8 degrees. Hereinafter, the description of a portion of the same content as that in the first embodiment will not be repeated.

Figure 8:
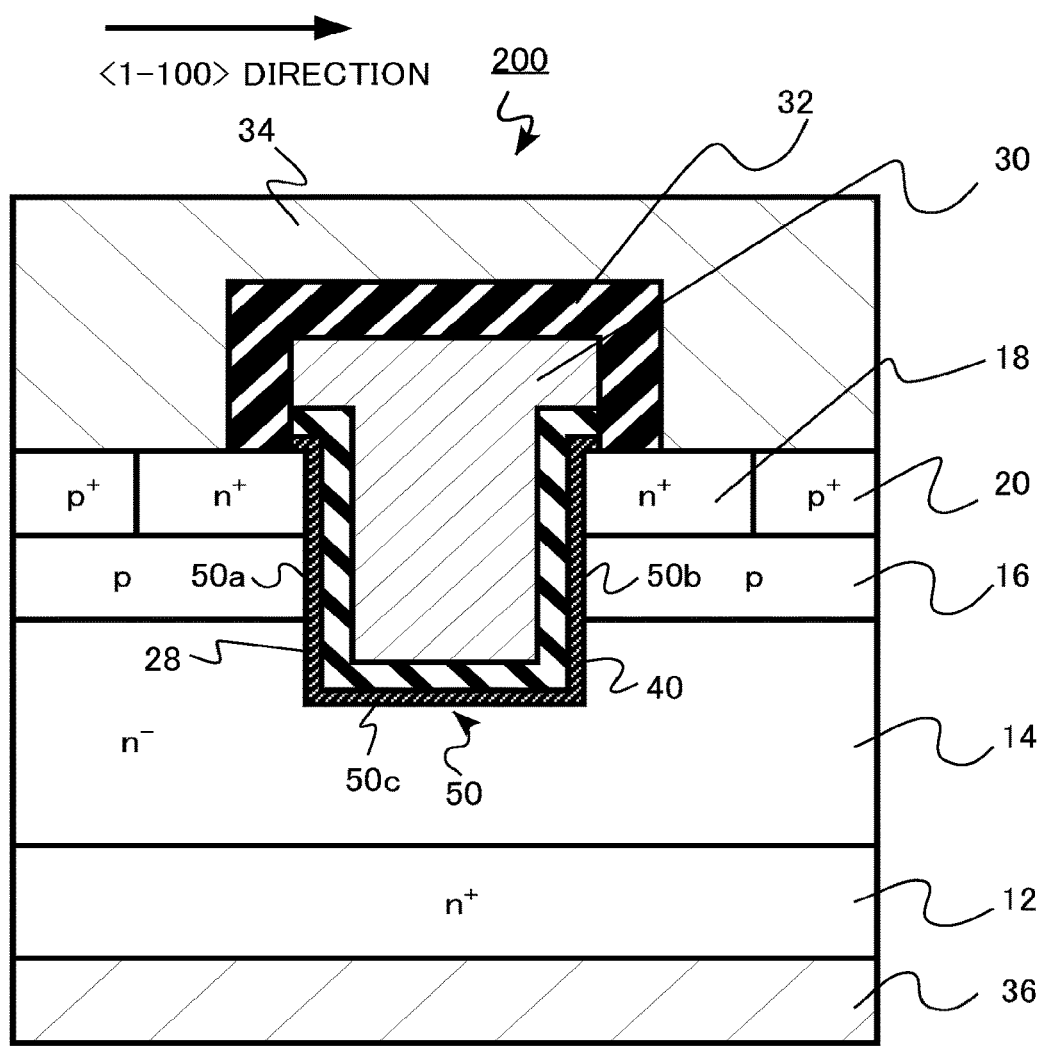
FIG. 8 is a cross-sectional view schematically illustrating a semiconductor device according to a second embodiment.

FIG. 8 is a cross-sectional view schematically illustrating the semiconductor device according to the second embodiment. The semiconductor device according to the second embodiment is a MOSFET 200. The MOSFET 200 is a trench gate MOSFET having a gate electrode provided in a trench. In addition, the MOSFET 200 is an n-channel MOSFET having electrons as carriers.

The MOSFET 200 includes a silicon carbide substrate 12, a drift layer 14 (silicon carbide layer), a p well region 16 (silicon carbide layer), a source region 18, a p well contact region 20, a gate insulating layer 28, a gate electrode 30, an interlayer insulating film 32, a source electrode 34, a drain electrode 36, an interface termination region 40 (region), and a trench 50. The trench 50 has a first side surface 50a, a second side surface 50b, and a bottom 50c.

An off angle between a surface of the silicon carbide substrate 12 and the silicon face is equal to or greater than 0 degrees and equal to or less than 8 degrees. An off direction of the surface of the silicon carbide substrate 12 is, for example, a <11-20> direction.

The trench 50 passes through the source region 18 and the p well region 16 and reaches the drift layer 14. The bottom 50c of the trench 50 is located at the drift layer 14.

The gate insulating layer 28 and the gate electrode 30 are provided in the trench 50.

The first side surface 50a and the second side surface 50b of the trench 50 are inclined at an angle that is equal to or greater than 0 degrees and equal to or less than 8 degrees with respect to the m face. An off angle between the first and second side surfaces 50a and 50b of the trench 50 and the m face is equal to or greater than 0 degrees and equal to or less than 8 degrees.

The first side surface 50a and the second side surface 50b of the trench 50 face the gate insulating layer 28. The gate insulating layer 28 come into contact with, for example, the first side surface 50a and the second side surface 50b. The off angle between the first and second side surfaces 50a and 50b and the m face is equal to or greater than 0 degrees and equal to or less than 8 degrees. An off angle between a surface of the p well region 16 which faces the gate insulating layer 28 and the m face is equal to or greater than 0 degrees and equal to or less than 8 degrees.

Figure 9:
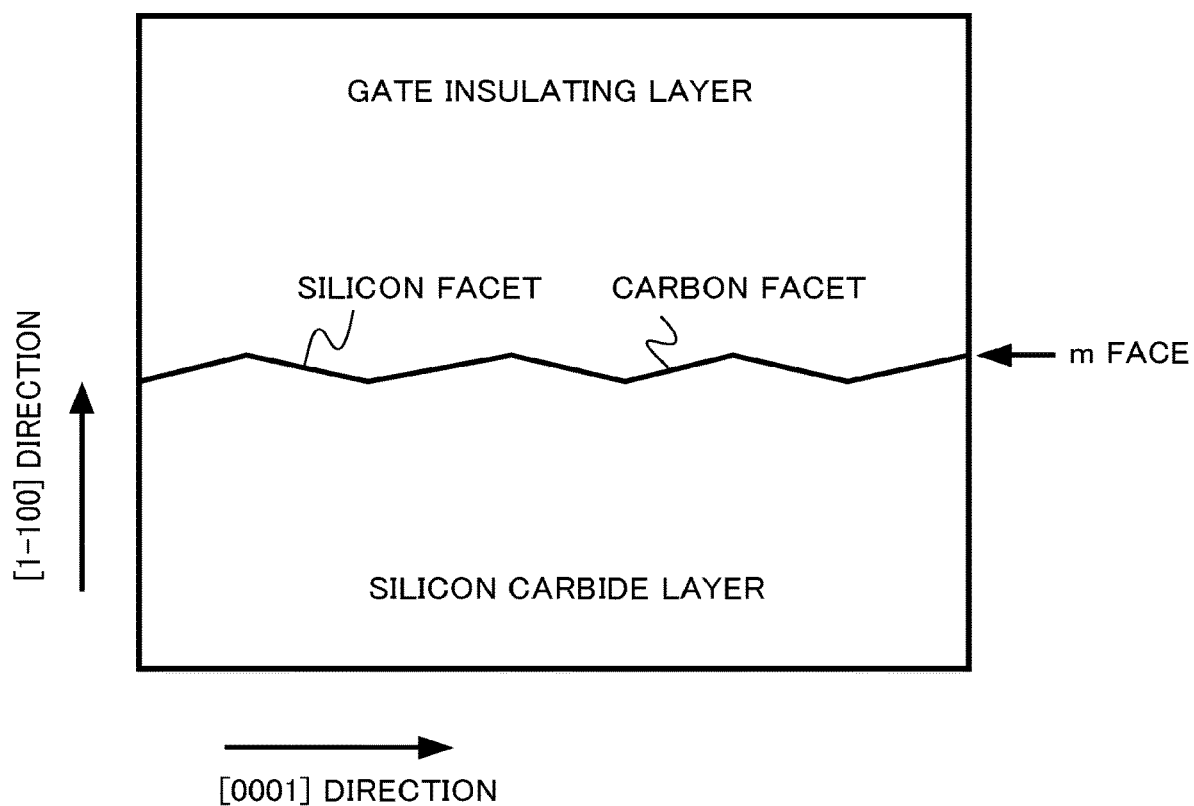
FIG. 9 is a diagram illustrating a surface of a silicon carbide layer of the semiconductor device according to the second embodiment.

FIG. 9 is a diagram illustrating the surface of the silicon carbide layer of the semiconductor device according to the second embodiment. FIG. 9 is an enlarged view schematically illustrating the gate insulating layer 28 and the surface of the p well region 16 which faces the gate insulating layer 28 in the MOSFET 200. In other words, FIG. 9 is an enlarged view schematically illustrating the first side surface 50a or the second side surface 50b of the trench 50.

The off angle between the first and second side surfaces 50a and 50b of the trench 50 and the m face is equal to or greater than 0 degrees and equal to or less than 8 degrees. In the enlarged view of the m face, as illustrated in FIG. 9, silicon facets and carbon facets are alternately repeated in the surface.

The surface of the silicon facet has the same structure as the silicon face. The surface of the carbon facet has the same structure as the carbon face.

The interface termination region 40 of the MOSFET 200 has the first bonding structure in a region including the silicon facet similarly to the first embodiment. That is, a threefold coordinated first nitrogen atom bonded to three first silicon atoms is included in the region including the silicon facet.

Figure 10A:
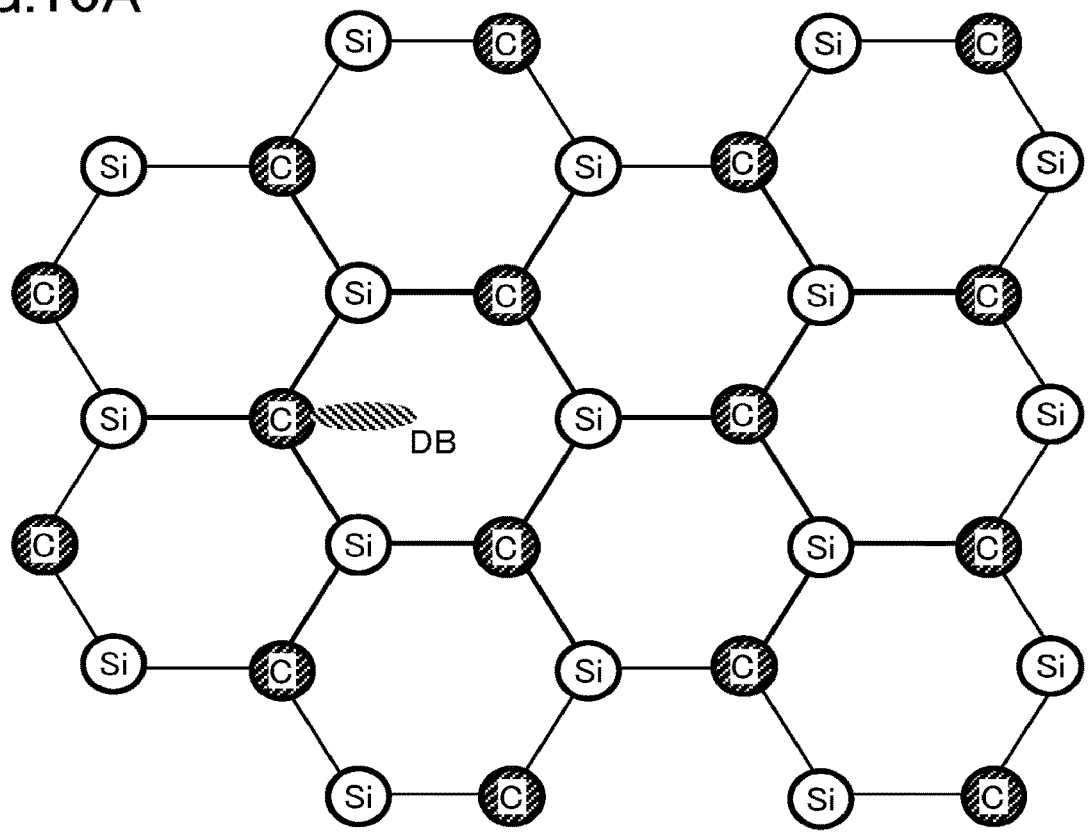
FIGS. 10A and 10B are diagrams illustrating an interface termination region according to the second embodiment.
Figure 10B:
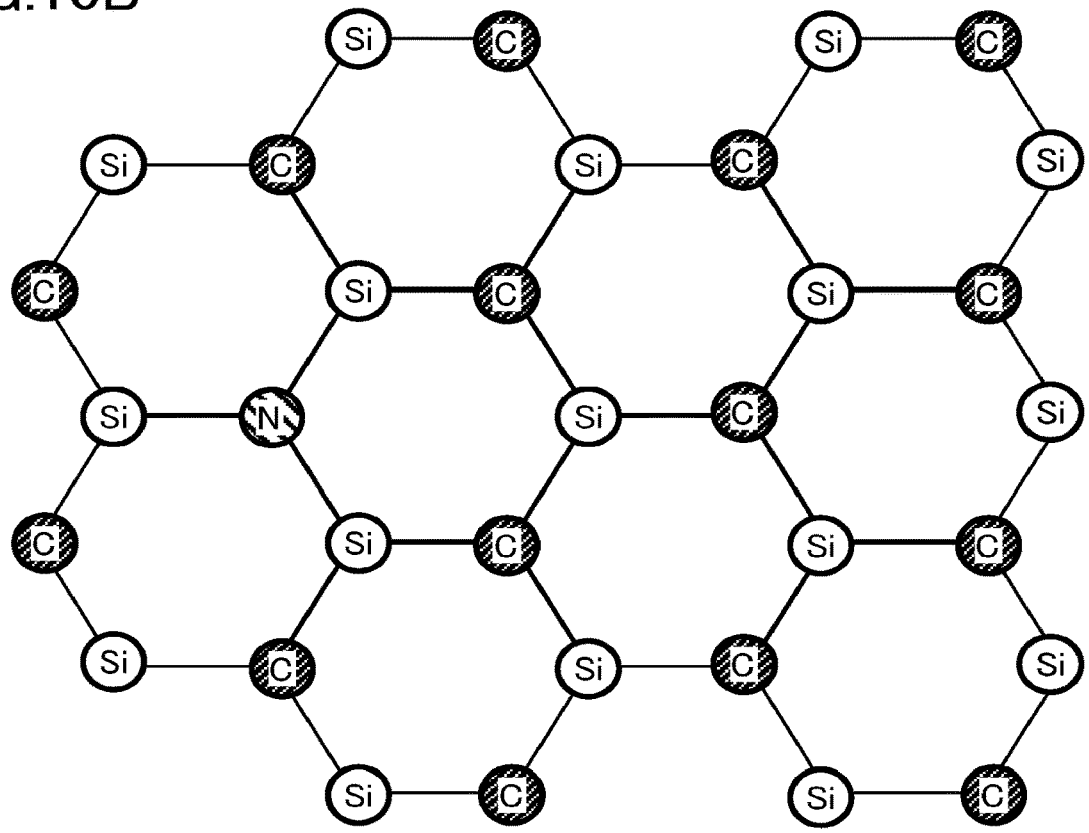

FIGS. 10A and 10B are diagrams illustrating the interface termination region according to the second embodiment. FIGS. 10A and 10B are diagrams illustrating the interface termination region 40 including the carbon facet in the MOSFET 200 according to the second embodiment.

FIG. 10A is a diagram illustrating a carbon dangling bond. FIG. 10B is a diagram illustrating an interface termination structure by a nitrogen atom. FIGS. 10A and 10B are top views illustrating the carbon facet of the m face of SiC. Carbon atoms (C) are arranged in the outermost surface and silicon atoms (Si) are arranged below the carbon atoms (C).

As illustrated in FIG. 10A, for example, one carbon atom (C) has a dangling bond (DB). For example, the other carbon atoms (C) are bonded to silicon atoms in silicon oxide (not illustrated).

The interface termination region 40 according to the second embodiment includes the interface termination structure illustrated in FIG. 10B. In the structure, the carbon atom (C) having the dangling bond (DB) is substituted with a threefold coordinated nitrogen atom (N). The nitrogen atom (N) is an example of the second nitrogen atom. The second nitrogen atom is a threefold coordinated atom and is bonded to three second silicon atoms. The dangling bond of the carbon atom (C) is removed by the interface termination structure illustrated in FIG. 10B.

Figure 11:
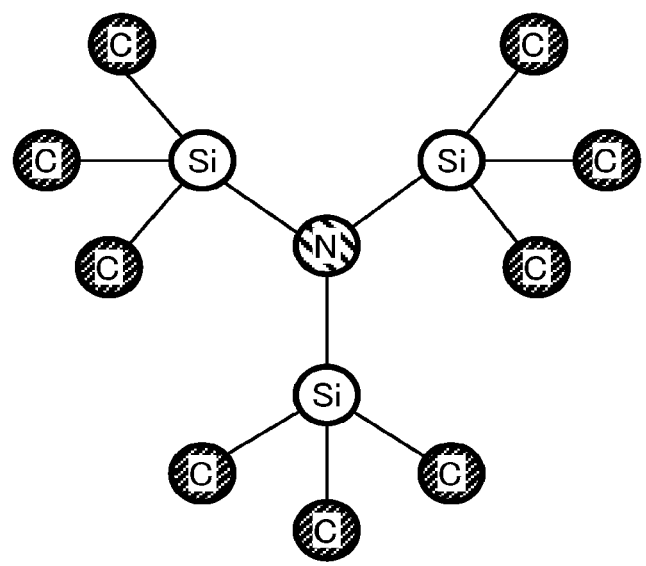
FIG. 11 is a diagram illustrating an interface termination structure according to the second embodiment.

FIG. 11 is a diagram illustrating the interface termination structure according to the second embodiment. FIG. 11 illustrates the bonding structure of the second nitrogen atom (N) in the interface termination region 40 including a carbon facet. In FIG. 11, the bonding of some atoms is not illustrated.

As illustrated in FIG. 11, all of three second silicon atoms (Si) are bonded to the second nitrogen atom (N) and three carbon atoms (C). All of the three second silicon atoms (Si) are fourfold coordinated atoms.

In other words, in the interface termination region 40 including the carbon facet, all of the second closest atoms to the second nitrogen atom (N) are carbon atoms (C). In contrast, at least one of the second closest atoms to the first nitrogen atom (N1) forming the first bonding structure of the interface termination region 40 including the silicon facet is an oxygen atom (O) as illustrated in FIG. 5A.

Figure 12:
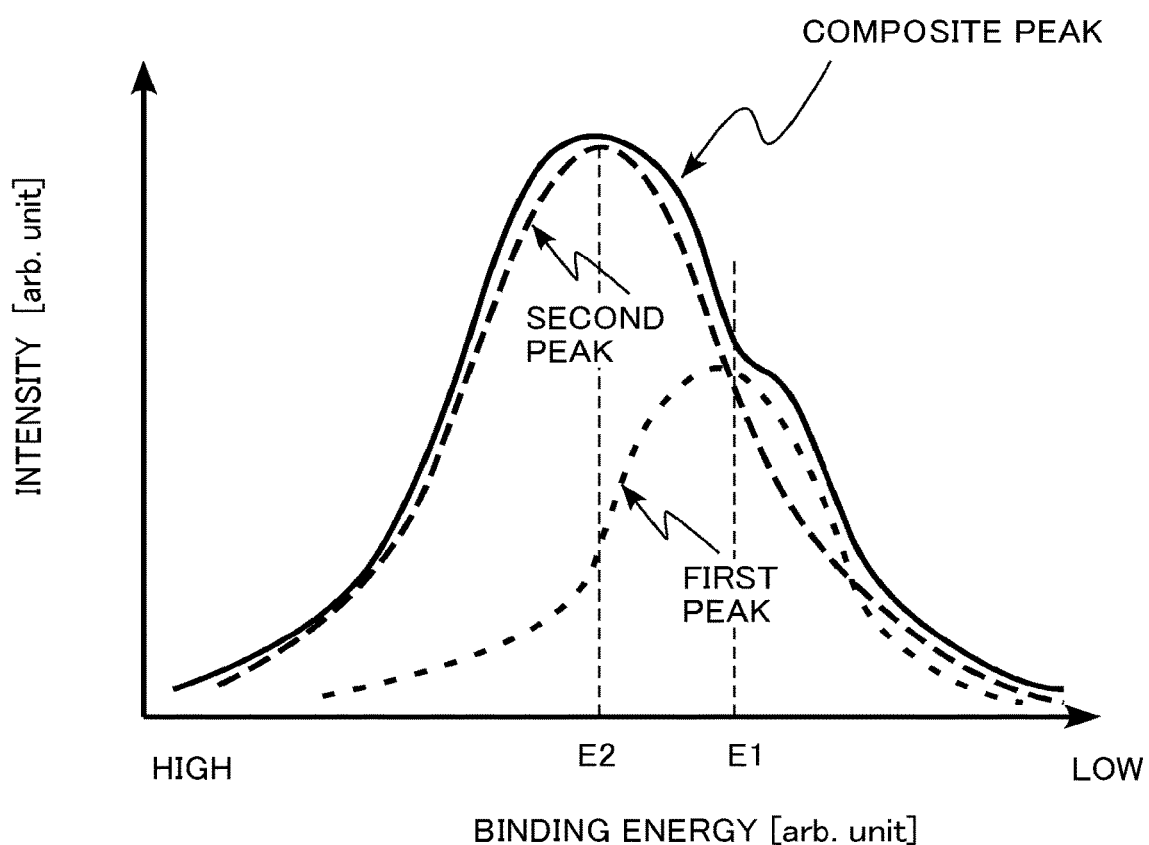
FIG. 12 is a diagram illustrating a spectrum of the semiconductor device according to the second embodiment obtained by X-ray photoelectron spectroscopy.

FIG. 12 is a diagram illustrating a spectrum of the semiconductor device according to the second embodiment obtained by X-ray photoelectron spectroscopy. A case in which the interface termination region 40 of the MOSFET 200 is analyzed by X-ray photoelectron spectroscopy is considered. The spectrum obtained by X-ray photoelectron spectroscopy has a composite peak which is decomposed into two peaks. The spectrum obtained by X-ray photoelectron spectroscopy has a first peak and a second peak.

The first peak results from the first bonding structure of the interface termination region 40 including the silicon facet. That is, the first peak results from the threefold coordinated first nitrogen atom (N1) bonded to three first silicon atoms (Si1).

In contrast, the second peak results from the termination structure by the nitrogen atom in the interface termination region 40 including the carbon facet. That is, the second peak results from the threefold coordinated second nitrogen atom (N) bonded to three second silicon atoms (Si).

The first peak has first binding energy (E1) and first intensity (I1). The second peak has second binding energy (E2) and second intensity (I2).

The second binding energy (E2) is higher than the first binding energy (E1). For example, the energy difference is caused by a difference between the bonding structures in which the same threefold coordinated nitrogen atom is present and the second closest atoms to the threefold coordinated nitrogen atom are different from each other.

For example, the second intensity (I2) is equal to or greater than 0.5 times and equal to or less than two times the first intensity (I1). In general, it is considered that, in the carbon facet in which a carbon atom (C) is present in the outermost surface, the carbon atom (C) is more easily substituted with a nitrogen atom (N) than that in the silicon facet. In this case, the second intensity (I2) is significantly higher than the first intensity (I1). For example, the second intensity (I2) is equal to or greater than three times the first intensity (I1).

However, since the first bonding structure is formed in the silicon facet in a non-oxidizing atmosphere using atomic hydrogen, it is possible to significantly improve the substitution efficiency of a carbon atom (C) with a nitrogen atom (N). Therefore, the second intensity (I2) may be equal to or greater than 0.5 times and equal to or less than two times the first intensity (I1).

A heat treatment accompanied by atomic hydrogen irradiation is performed in a non-oxidizing atmosphere for a long time to further improve the substitution efficiency. As a result of the improvement of the efficiency, the second intensity (I2) can be equal to or greater than 0.75 times and equal to or less than 1.5 times the first intensity (I1). As the second intensity (I2) and the first intensity (I1) become closer to the same level (1.0 time), the termination efficiency of the interface termination region 40 becomes higher, which is preferable.

In order to suppress a reduction in the mobility of carriers in the MOSFET 200, the off angle between a surface of the silicon carbide layer which faces the gate insulating layer 28 and the m face is preferably equal to or less than 4 degrees and is more preferably equal to or less than 2 degrees.

As described above, according to the second embodiment, dangling bonds are reduced in the surface of the silicon carbide layer. Therefore, a reduction in the mobility of carriers in a MOSFET is suppressed. In addition, a MOSFET with high reliability is achieved. Further, since the semiconductor device is a trench gate type, channel density per unit area in a chip increases and on-resistance is reduced.

Third Embodiment

An inverter circuit and a driving device according to a third embodiment include the semiconductor device according to the first embodiment.

Figure 13:
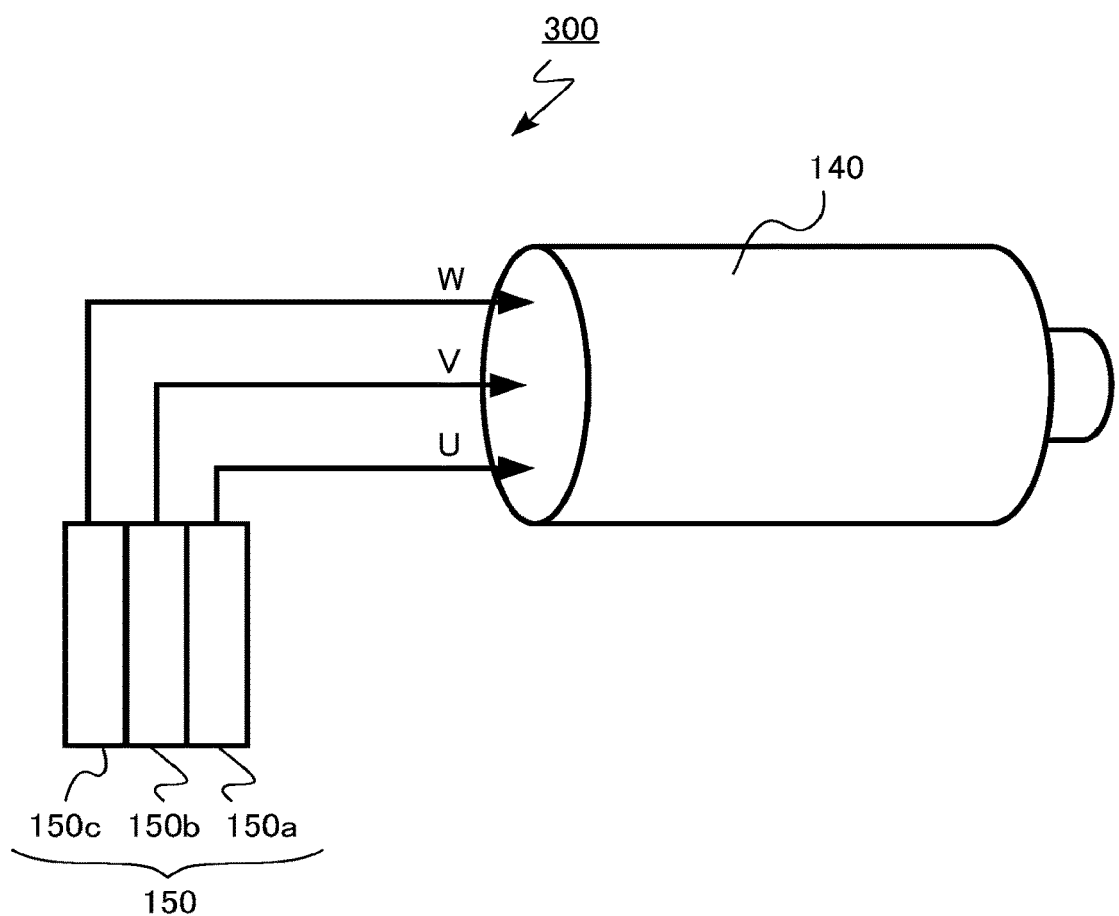
FIG. 13 is a diagram schematically illustrating a driving device according to a third embodiment.

FIG. 13 is a diagram schematically illustrating the driving device according to the third embodiment. A driving device 300 includes a motor 140 and an inverter circuit 150.

The inverter circuit 150 includes three semiconductor modules 150a, 150b, and 150c each of which has the MOSFET 100 according to the first embodiment as a switching element. The three semiconductor modules 150*a*, 150*b*, and 150*c* are connected in parallel to each other to achieve the three-phase inverter circuit 150 having three alternating current voltage output terminals U, V, and W. The motor 140 is driven by an alternating current voltage output from the inverter circuit 150.

According to the third embodiment, since the MOSFET 100 with improved characteristics is provided, the characteristics of the inverter circuit 150 and the driving device 300 are improved.

Fourth Embodiment

A vehicle according to a fourth embodiment includes the semiconductor device according to the first embodiment.

Figure 14:
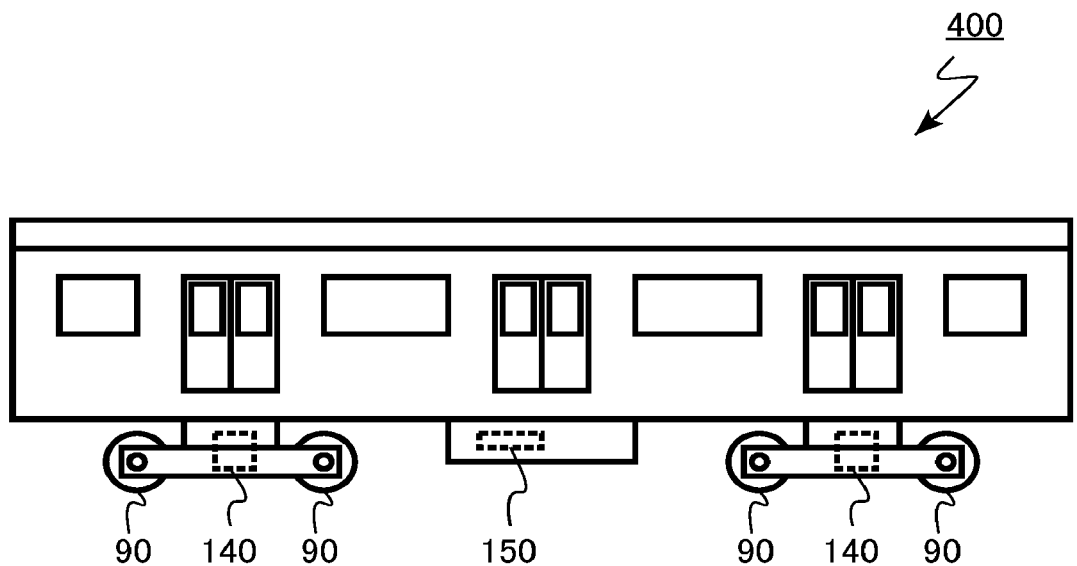
FIG. 14 is a diagram schematically illustrating a vehicle according to a fourth embodiment.

FIG. 14 is a diagram schematically illustrating the vehicle according to the fourth embodiment. A vehicle 400 according to the fourth embodiment is a railway vehicle. The vehicle 400 includes a motor 140 and an inverter circuit 150.

The inverter circuit 150 includes three semiconductor modules each of which has the MOSFET 100 according to the first embodiment as a switching element. The three semiconductor modules are connected in parallel to each other to achieve the three-phase inverter circuit 150 having three alternating current voltage output terminals U, V, and W. The motor 140 is driven by an alternating current voltage output from the inverter circuit 150. Wheels 90 of the vehicle 400 are rotated by the motor 140.

According to the fourth embodiment, since the MOSFET 100 with improved characteristics is provided, the characteristics of the vehicle 400 are improved.

Fifth Embodiment

A vehicle according to a fifth embodiment includes the semiconductor device according to the first embodiment.

Figure 15:
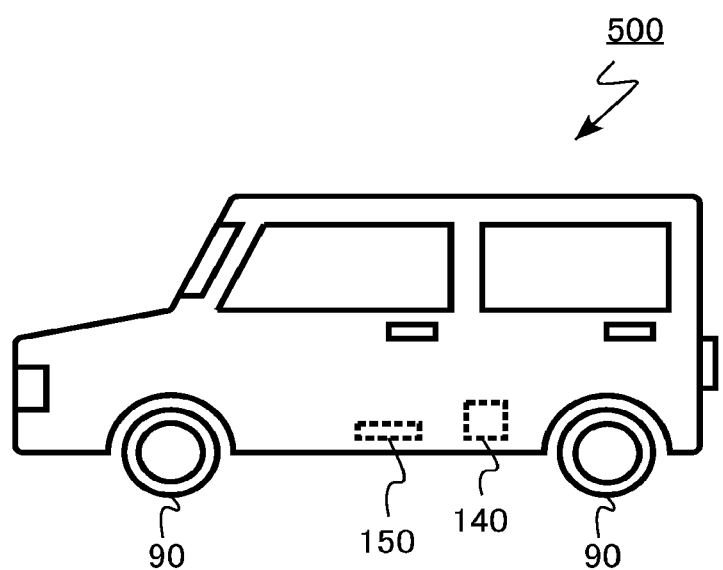
FIG. 15 is a diagram schematically illustrating a vehicle according to a fifth embodiment.

FIG. 15 is a diagram schematically illustrating the vehicle according to the fifth embodiment. A vehicle 500 according to the fifth embodiment is a car. The vehicle 500 includes a motor 140 and an inverter circuit 150.

The inverter circuit 150 includes three semiconductor modules each of which has the MOSFET 100 according to the first embodiment as a switching element. The three semiconductor modules are connected in parallel to each other to achieve the three-phase inverter circuit 150 having three alternating current voltage output terminals U, V, and W.

The motor 140 is driven by an alternating current voltage output from the inverter circuit 150. Wheels 90 of the vehicle 500 are rotated by the motor 140.

According to the fifth embodiment, since the MOSFET 100 with improved characteristics is provided, the characteristics of the vehicle 500 are improved.

Sixth Embodiment

An elevator according to a sixth embodiment includes the semiconductor device according to the first embodiment.

Figure 16:
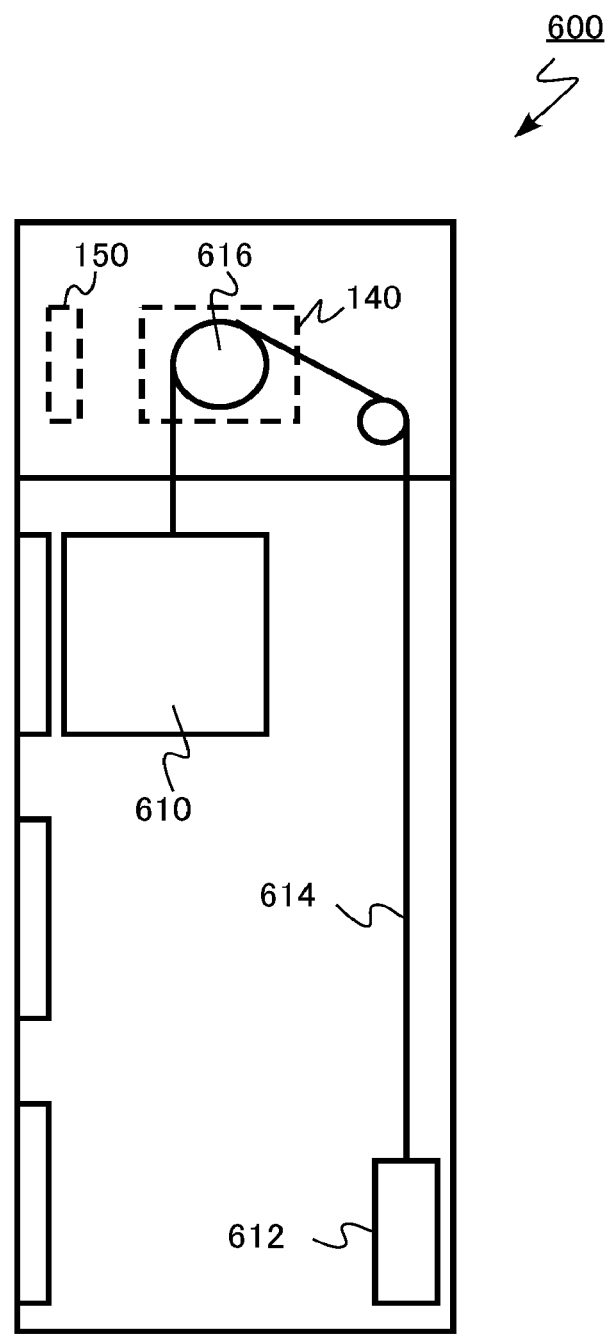
FIG. 16 is a diagram schematically illustrating an elevator according to a sixth embodiment.

FIG. 16 is a diagram schematically illustrating the elevator according to the sixth embodiment. An elevator 600 according to the sixth embodiment includes a car 610, a counterweight 612, a wire rope 614, a hoisting machine 616, a motor 140, and an inverter circuit 150.

The inverter circuit 150 includes three semiconductor modules each of which has the MOSFET 100 according to the first embodiment as a switching element. The three semiconductor modules are connected in parallel to each other to achieve the three-phase inverter circuit 150 having three alternating current voltage output terminals U, V, and W.

The motor 140 is driven by an alternating current voltage output from the inverter circuit 150. The hoisting machine 616 is rotated by the motor 140 and the car 610 goes up and down.

According to the sixth embodiment, since the MOSFET 100 with improved characteristics is provided, the characteristics of the elevator 600 are improved.

In the first and second embodiments, a case in which 4H—SiC is used as the crystal structure of silicon carbide has been described as an example. However, the embodiments may be applied to silicon carbide with other crystal structures such as 6H—SiC and 3C—SiC.

In the first and second embodiments, a case in which the gate insulating layer 28 is provided on the silicon face or the m face of silicon carbide has been described as an example. However, for example, the embodiments may be applied to a case in which the gate insulating layer 28 is provided on other faces of silicon carbide, such as an a face and a (0-33-8) face.

For example, in a MOS interface nitrogen termination process using NO nitridation, oxygen draws carbon from the interface and nitrogen is introduced to the position of the drawn carbon. Therefore, interface nitridation accompanied by interface oxidation occurs.

In the embodiments, after the insulating film is formed, the first heat treatment (a heat treatment accompanied by atomic hydrogen irradiation in a non-oxidizing atmosphere) is performed. Then, a hydrogen atom draws carbon from the interface and nitrogen is introduced to the position of the carbon. Therefore, interface oxidation does not occur and it is possible to introduce nitrogen to the position of carbon with high efficiency.

The first heat treatment can be applied not only to a case in which the MOS interfaces of the Si face and the m face are formed but also to the C face, the a face and the (0-33-8) face. In this case, it is possible to form a nitrogen termination interface having good characteristics with high efficiency.

In addition, it is possible to eliminate the charge trap of the insulating film/SiC interface. Therefore, the embodiments may be used for a process for eliminating the charge trap of a passivation insulating film/SiC interface in the termination region.

Further, the embodiments may be applied to an n-channel insulated gate bipolar transistor (IGBT).

Furthermore, the embodiments are not limited to the n channel type and may be applied to a p-channel MOSFET or IGBT.

In the third to sixth embodiments, a case in which the semiconductor device according to the embodiments is applied to the vehicle or the elevator has been described as an example. However, the semiconductor device according to the embodiments may be applied to, for example, a power conditioner of a photovoltaic power generation system.

While certain embodiments have been described, these embodiments have been presented by way of example only, and are not intended to limit the scope of the inventions. Indeed, the semiconductor device, the semiconductor device manufacturing method, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer;
a gate electrode;
a gate insulating layer provided between the silicon carbide layer and the gate electrode; and
a region located between the silicon carbide layer and the gate insulating layer, the region having a first bonding structure, the first bonding structure including a threefold coordinated first nitrogen atom bonded to three first silicon atoms, a threefold coordinated second nitrogen atom bonded to three second silicon atoms, and a threefold coordinated third nitrogen atom bonded to three third silicon atoms, the first to third nitrogen atoms being adjacent to each other in the first bonding structure.

2. The semiconductor device according to claim 1, wherein, in the first bonding structure, one of the three first silicon atoms and one of the three second silicon atoms are bonded to same carbon atom, one of the three second silicon atoms and one of the three third silicon atoms are bonded to same carbon atom, and one of the three third silicon atoms and one of the three first silicon atoms are bonded to same carbon atom.

3. The semiconductor device according to claim 1, wherein a nitrogen concentration distribution of the silicon carbide layer, the region, and the gate insulating layer has a peak in the region.

4. The semiconductor device according to claim 3, wherein a nitrogen concentration of the peak is equal to or greater than $1.2 \times 10^{19}$ cm$^{-3}$ and equal to or less than $2.4 \times 10^{22}$ cm$^{-3}$.

5. The semiconductor device according to claim 1, wherein an off angle between a surface of the silicon carbide layer facing the gate insulating layer and an m face is equal to or less than 8 degrees.

6. The semiconductor device according to claim 1, wherein a density of the first bonding structure in the region is larger than a density of second bonding structure in the region, the second bonding structure including a threefold coordinated nitrogen atom and two carbon atoms bonded to each other, the threefold coordinated nitrogen atom and the two carbon atoms being adjacent to each other.

7. The semiconductor device according to claim 6, wherein a density of the second bonding structure in the region is less than 10% of a density of the first bonding structure in the region.

8. The semiconductor device according to claim 1, wherein a density of NSi$_2$O in the region is less than $1.2 \times 10^{16}$ cm$^{-3}$.

9. An inverter circuit comprising the semiconductor device according to claim 1.

10. A driving device comprising the semiconductor device according to claim 1.

11. A vehicle comprising the semiconductor device according to claim 1.

12. An elevator comprising the semiconductor device according to claim 1.

13. A semiconductor device comprising:
a silicon carbide layer;
a gate electrode;
a gate insulating layer provided between the silicon carbide layer and the gate electrode; and
a region located between the silicon carbide layer and the gate insulating layer, a spectrum of the region obtained by X-ray photoelectron spectroscopy having a first peak and a second peak, the first peak caused by a threefold coordinated first nitrogen atom bonded to three first silicon atoms, the first peak having first binding energy and first intensity, the second peak caused by a threefold coordinated second nitrogen atom bonded to three second silicon atoms, the second peak having second binding energy higher than the first binding energy and second intensity,
wherein an off angle between a surface of the silicon carbide layer facing the gate insulating layer and an m face is equal to or less than 8 degrees.

14. The semiconductor device according to claim 13, wherein at least one of the three first silicon atoms is bonded to an oxygen atom, and
the three second silicon atoms are bonded to the second nitrogen atom and three carbon atoms.

15. The semiconductor device according to claim 13, wherein at least one of second closest atoms to the first nitrogen atom is an oxygen atom, and
all of second closest atoms to the second nitrogen atom are carbon atoms.

16. The semiconductor device according to claim 13, wherein the second intensity is equal to or greater than 0.5 times and equal to or less than two times the first intensity.

17. The semiconductor device according to claim 13, wherein a nitrogen concentration distribution of the silicon carbide layer, the region, and the gate insulating layer has a peak in the region.

18. The semiconductor device according to claim 17, wherein a nitrogen concentration of the peak is equal to or greater than $1.2 \times 10^{19}$ cm$^{-3}$ and equal to or less than $2.4 \times 10^{22}$ cm$^{-3}$.

19. The semiconductor device according to claim 13, wherein the gate insulating layer is made of silicon oxide.

20. A method for manufacturing a semiconductor device, the method comprising:
forming a gate insulating layer on a silicon carbide layer;
performing a first heat treatment of irradiating the gate insulating layer with atomic hydrogen (H) in a nitrogen atmosphere of 1000° C. or higher; and
forming a gate electrode on the gate insulating layer.

21. The method for manufacturing a semiconductor device according to claim 20, further comprising:
performing a second heat treatment in an oxidizing atmosphere of 900° C. or lower after the first heat treatment.

22. The method for manufacturing a semiconductor device according to claim 20, further comprising:
performing a third heat treatment in a non-oxidizing atmosphere at a temperature lower than a temperature in the first heat treatment after the first heat treatment.

23. The method for manufacturing a semiconductor device according to claim 20,
wherein the atomic hydrogen (H) is generated by a heated catalyzer method in the first heat treatment.

* * * * *